(12) United States Patent
Dalal et al.

(10) Patent No.: US 11,966,003 B2
(45) Date of Patent: Apr. 23, 2024

(54) SYSTEM AND METHOD FOR A SECURITY POST

(71) Applicant: ZKTECO USA, Alpharetta, GA (US)

(72) Inventors: Manish Dalal, Alpharetta, GA (US); Chengyue Wang, Alpharetta, GA (US); Tonghu Mao, Alpharetta, GA (US); Shuilun Feng, Alpharetta, GA (US)

(73) Assignee: ZKTECO USA LLC, Alpharetta, GA (US)

( * ) Notice: Subject to any disclaimer, the term of this patent is extended or adjusted under 35 U.S.C. 154(b) by 276 days.

(21) Appl. No.: 17/599,904

(22) PCT Filed: Mar. 27, 2020

(86) PCT No.: PCT/US2020/025179
§ 371 (c)(1),
(2) Date: Sep. 29, 2021

(87) PCT Pub. No.: WO2020/198575
PCT Pub. Date: Oct. 1, 2020

(65) Prior Publication Data
US 2022/0196872 A1 Jun. 23, 2022

Related U.S. Application Data

(60) Provisional application No. 62/825,407, filed on Mar. 28, 2019, provisional application No. 62/825,454, filed on Mar. 28, 2019.

(51) Int. Cl.
*G01V 3/10* (2006.01)
*G01R 33/04* (2006.01)
(Continued)

(52) U.S. Cl.
CPC .............. *G01V 3/10* (2013.01); *G01R 33/04* (2013.01); *G01V 3/101* (2013.01); *G01V 3/108* (2013.01);
(Continued)

(58) Field of Classification Search
CPC .......... G01V 3/10; G01V 3/101; G01V 3/108; G01R 33/04; G06F 18/21; G06F 18/22;
(Continued)

(56) References Cited

U.S. PATENT DOCUMENTS 5,012,455 A 4/1991 Schwarz et al.
2008/0117044 A1 5/2008 Hibbs
(Continued)

OTHER PUBLICATIONS

International Search Report and Written Opinion dated Jun. 16, 2020 in International Application PCT/US2020/025179.
(Continued)

*Primary Examiner* — Farhana A Hoque
(74) *Attorney, Agent, or Firm* — Venable LLP

(57) ABSTRACT

The present teaching relates to method, system, medium, and implementations for detecting a target object via a security post. A plurality of sections are arranged in a vertical direction. Each section is designated to detect the target object in a vertical range by receiving information related to magnetic field from one or more sensors, analyzing the sensed information to extract features characterizing the magnetic field variations in the corresponding vertical range, and determining whether the target object is present in the vertical range based on the extracted features. When the target object is detected by a section, an alarm associated with the section is triggered to indicate the detection. An overall detection result is determined based on the detection result from each of the sections and is displayed on a display screen.

18 Claims, 29 Drawing Sheets

(51) Int. Cl.
*G06F 18/21* (2023.01)
*G06F 18/22* (2023.01)
*G06F 18/24* (2023.01)
*G06F 18/25* (2023.01)
*G06V 40/16* (2022.01)

(52) U.S. Cl.
CPC .............. *G06F 18/21* (2023.01); *G06F 18/22* (2023.01); *G06F 18/24* (2023.01); *G06F 18/256* (2023.01); *G06V 40/174* (2022.01)

(58) Field of Classification Search
CPC ..... G06F 18/24; G06F 18/256; G06V 40/174; G06N 20/00
USPC ....................................................... 324/234
See application file for complete search history.

(56) References Cited

U.S. PATENT DOCUMENTS

| | | | |
|---|---|---|---|
| 2008/0231443 A1* | 9/2008 | Kotter | G08B 13/24 340/551 |
| 2014/0338006 A1 | 11/2014 | Grkov et al. | |
| 2016/0086466 A1 | 3/2016 | Foster et al. | |

OTHER PUBLICATIONS

International Preliminary Report on Patentability dated Sep. 28, 2021 in International Application PCT/US2020/025179.
National Urban Security Technology Laboratory. "Walk-Through Metal Detectors Market Survey Report." Jun. 2014 (Jun. 2014) Retrieved on May 24, 2020 (May 24, 2020) from <https:1/ www.dhs.gov/sites/defaulUfiles/publications/WTMD-MSR_0614-508.pdf>.

* cited by examiner

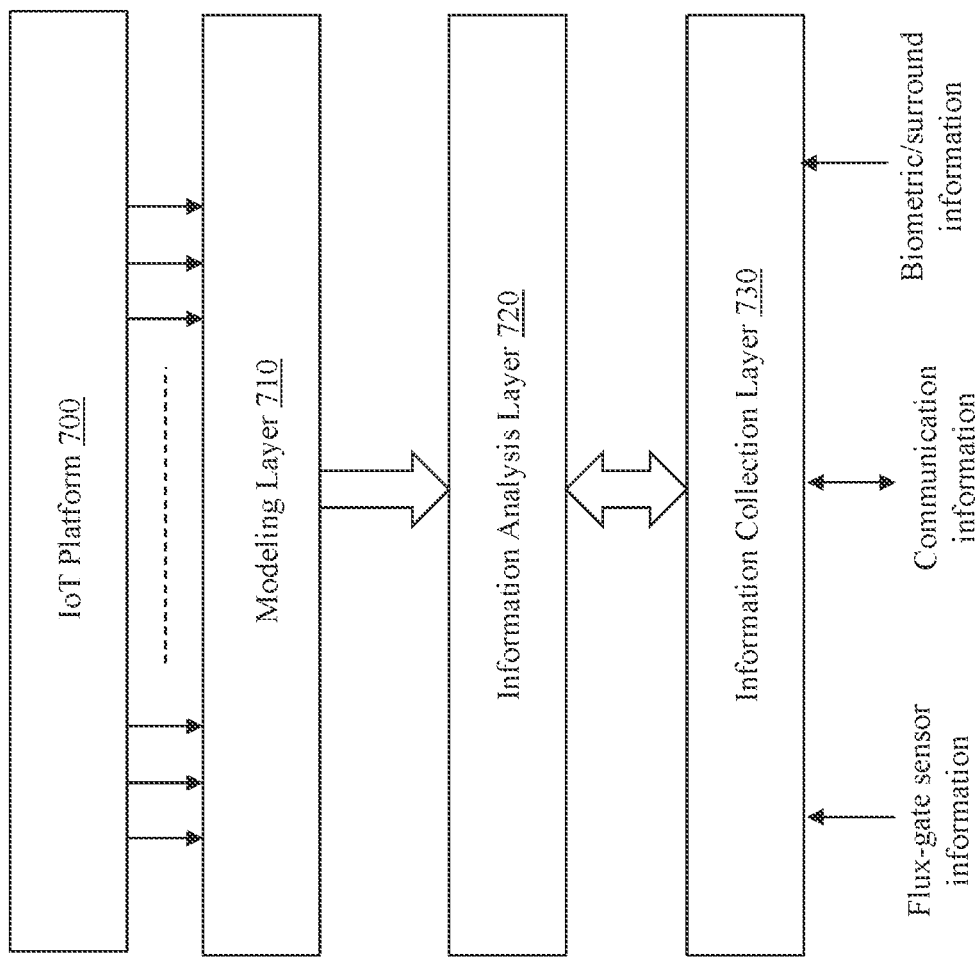

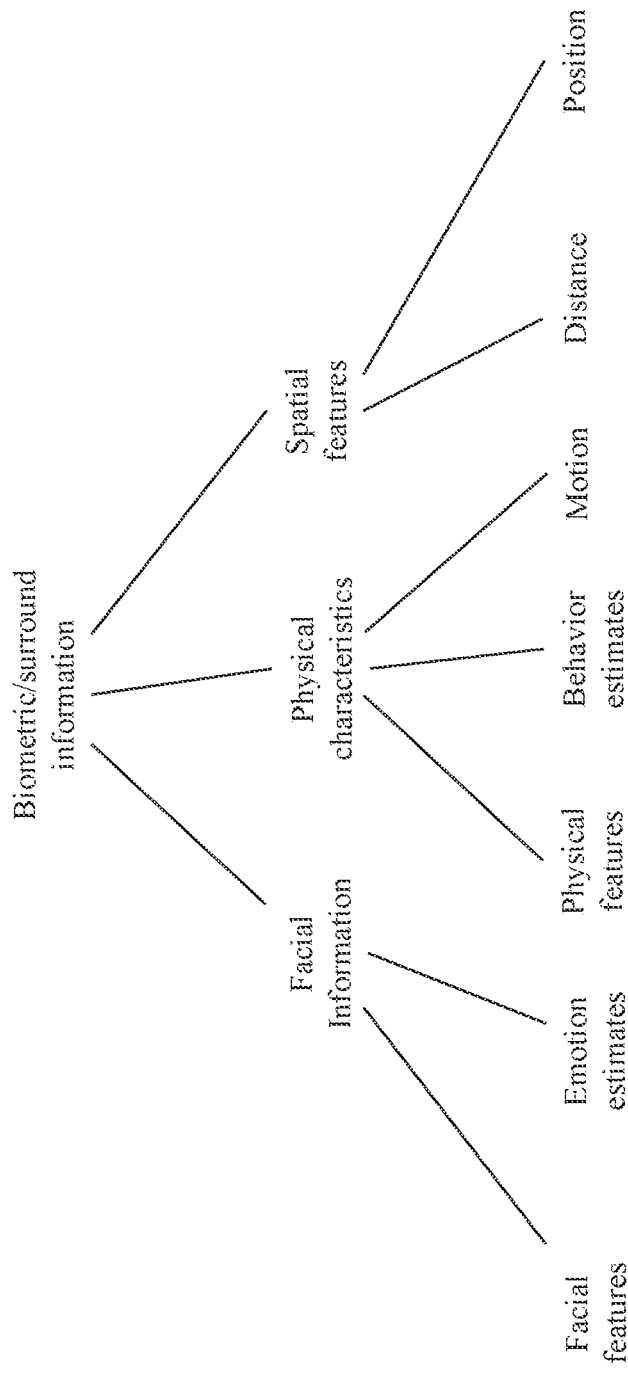

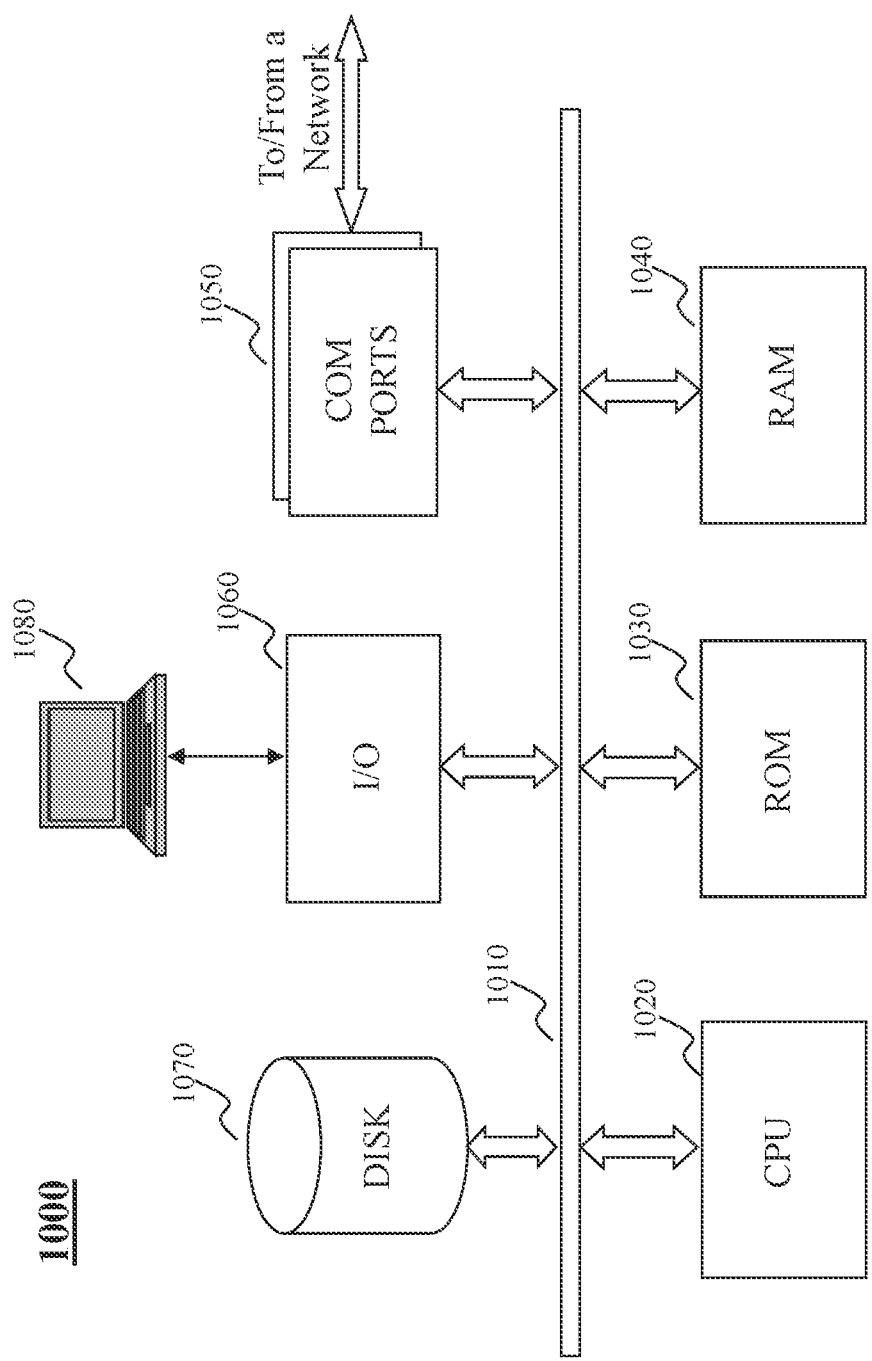

SYSTEM AND METHOD FOR A SECURITY POST

CROSS-REFERENCE TO RELATED APPLICATIONS

This application is a national stage application, filed under 35 U.S.C. § 371, of International Application PCT/US2020/025179, filed on Mar. 27, 2020, entitled "SYSTEM AND METHOD FOR A SECURITY POST", which claims priority to U.S. provisional application No. 62/825,454, filed Mar. 28, 2019, and to U.S. provisional application No. 62/825,407, filed Mar. 28, 2019, the contents of which are incorporated herein by reference in their entirety.

BACKGROUND

1. Technical Field

The present teaching generally relates to security. More specifically, the present teaching relates to security apparatus and object detection thereof.

2. Technical Background

Security is an important aspect of daily life to ensure the safety of the public. This is especially so at public forums such as locales for public transportation (e.g., airports, train stations, bus stations, etc.), conferences, etc. The security door is a type of security checking means often deployed at, e.g., airports, train station, access points for government offices or companies, cruise ships, etc. to detect metal objects that may be used as weapons. Security doors are usually deployed at places where there is a substantial flow of people (e.g., airports, conferences, or cruise ships). One example security door is shown in FIG. 1 (PRIOR ART). As shown, the example security door 100 is shaped as a door with two vertical posts 110-1 and 110-2 and a ceiling portion 120. For security check, there may be a detection device embedded in the security door and deployed for detecting certain designated object. For example, current security doors installed at public places can detect metal objects such as guns, knives, or scissors. When a person being security screened walks through the security door 100, the security door will set off alarm if the person is carrying a metal object.

With the advancement of such detection and reliability of such detection, methods of hiding harmful objects have also been developed. For instance, instead of metal objects, some criminal may find ways to make an electronic device as a potential weapon by incorporating means to attack in such an electronic device, including in a laptop, a tablet, a phone, or even a very small electronic device. Presently, although security doors may be used to detect, in a contactless manner, presence of metal objects, they cannot detect the presence of an electronic device.

Thus, there is a need for methods and systems that address such limitations.

SUMMARY

The teachings disclosed herein relate to methods, systems, and programming for data processing. More particularly, the present teaching relates to methods, systems, and programming related to modeling a scene to generate scene modeling information and utilization thereof.

In one example, a method, implemented on a machine having at least one processor and a communication platform capable of connecting to a network for detecting a target object via a security post. A plurality of sections are arranged in a vertical direction. Each section is designated to detect the target object in a vertical range by receiving information related to magnetic field from one or more sensors, analyzing the sensed information to extract features characterizing the magnetic field variations in the corresponding vertical range, and determining whether the target object is present in the vertical range based on the extracted features. When the target object is detected by a section, an alarm associated with the section is triggered to indicate the detection. An overall detection result is determined based on the detection result from each of the sections and is displayed on a display screen.

In a different example, the present teaching discloses a security post for detecting a target object. The security post comprises a base, an overall alarm, and a plurality of sections, and a signal integration unit. The plurality of sections are arranged in a vertical direction between the base and the overall alarm and each of the plurality of sections is designated to detect the target object within a corresponding vertical range. The signal integration unit is configured for integrating the detection results from the plurality of sections to derive an overall detection result. Each of the sections further comprises one or more sensors configured for sensing information related to magnetic field in the corresponding vertical range, a signal processing unit configured for analyzing the information to extract features characterizing magnetic field variations sensed in the corresponding vertical range and determining whether the target object is detected within the corresponding vertical range based on the extracted features, and a section alarm configured to be triggered when the target object is detected.

Other concepts relate to software for implementing the present teaching. A software product, in accord with this concept, includes at least one machine-readable non-transitory medium and information carried by the medium. The information carried by the medium may be executable program code data, parameters in association with the executable program code, and/or information related to a user, a request, content, or other additional information.

In one example, a machine-readable, non-transitory and tangible medium having data recorded thereon for detecting a target object via a security post, having a plurality of sections arranged in a vertical direction. Each section is programmed to detect the target object in a vertical range by receiving information related to magnetic field from one or more sensors, analyzing the sensed information to identify a pattern characterizing the magnetic field variations in the corresponding vertical range, and determining whether the target object is present in the vertical range based on the identified pattern. When the target object is detected by a section, an alarm associated with the section is triggered to indicate the detection. An overall detection result is determined based on the detection result from each of the sections and is displayed on a display screen.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The methods, systems and/or programming described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 7A depicts an exemplary high level architecture of a system in a security post for detecting metallic/electronic objects, in accordance with an embodiment of the present teaching;

FIG. 7B shows different types of information that a security post may extract in order to detect different types of information, in accordance with an embodiment of the present teaching;

FIG. 10 is an illustrative diagram of an exemplary computing device architecture that may be used to realize a specialized system implementing the present teaching in accordance with various embodiments.

DETAILED DESCRIPTION

Figure 1:
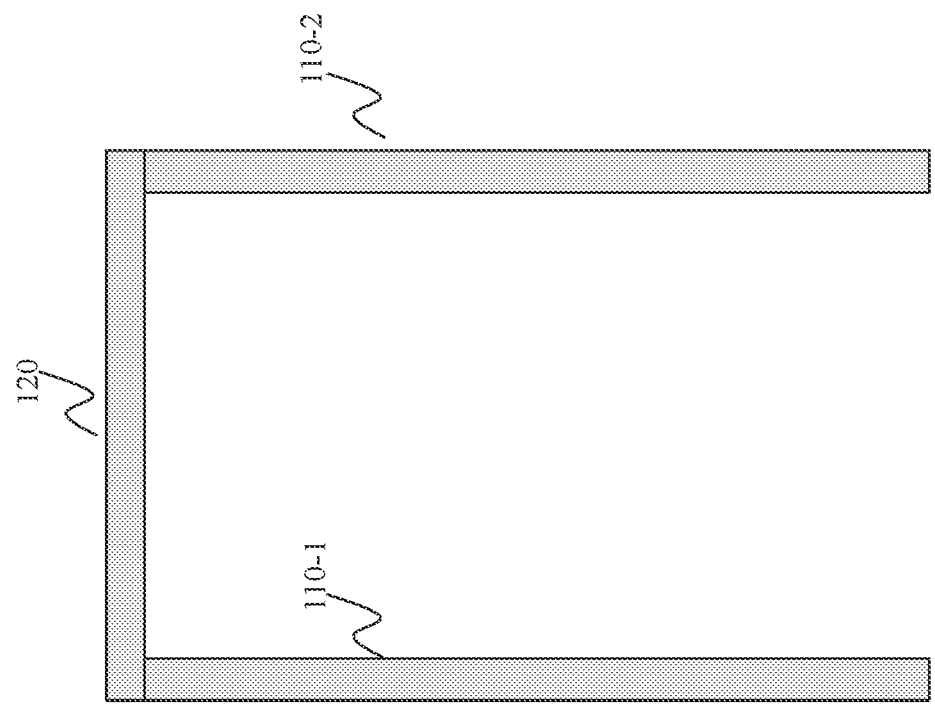
FIG. 1 (PRIOR ART) illustrates a traditional security door with posts.

In the following detailed description, numerous specific details are set forth by way of examples in order to facilitate a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The present teaching aims to address the deficiencies of the traditional security post for detecting metal objects. Specifically, the present teaching discloses a security post that is capable of detecting presence of either a metal object or an electronic devices. In some embodiments, the present teaching discloses to not only detect the existence of metal substances with complex composition but also accurately distinguish whether the detected metal substance is mixed with metal waste or electronic devices. That is, via analysis of signals such as certain pattern in variance of the magnetic field caused by detected metal, it can be determined whether an electronic device is present. In some embodiments, the presence of an electronic device may also be detected via communication means. Once metal mixture is detected, which may indicate presence of an electronic device, one or more communication signals complying with certain corresponding protocols may be transmitted in a configured range. If a response signal is received, it confirms the presence of an electronic device.

In some embodiments, the security post according to the present invention is assembled with different sections, each of which is independently configured to detect metal or electronic object. As different sections of the security post correspond to different heights, the sectional detection enables to identify a more precise location of the detected metal/electronic object. Each of the sections may include its own detection means and alarm means so that it may trigger alarm when metal/electronic object is detected. In some embodiments, one of the sections of the security post according to the present teaching may include a display screen for display detection information and providing an interface for a user to specify or set operational parameters to be used by different sections to function. In some embodiments, the detection of metal object may be carried out by each of the sections independently and the detection of an electronic object may be carried out based on the metal detection signals from different sections in an integrated manner. In some embodiments, detection result may be sent to a server located elsewhere for, e.g., centralized control and data recording.

In some embodiments, the security post according to the present teaching may be further configured to activate, when either a metal object or an electronic object is detected, the means to acquire additional information related to the surroundings of the detection. Such additional information may include biometric information (such as facial information) and surrounding information (such as physical, emotional, behavioral, or spatial information associated with the detection), either acquired from sensors or analyzed based on sensor data. Such additional information provides useful contextual information for the detected metal/electronic object and the person who hides the detected metal/electronic object.

Figure 2A:
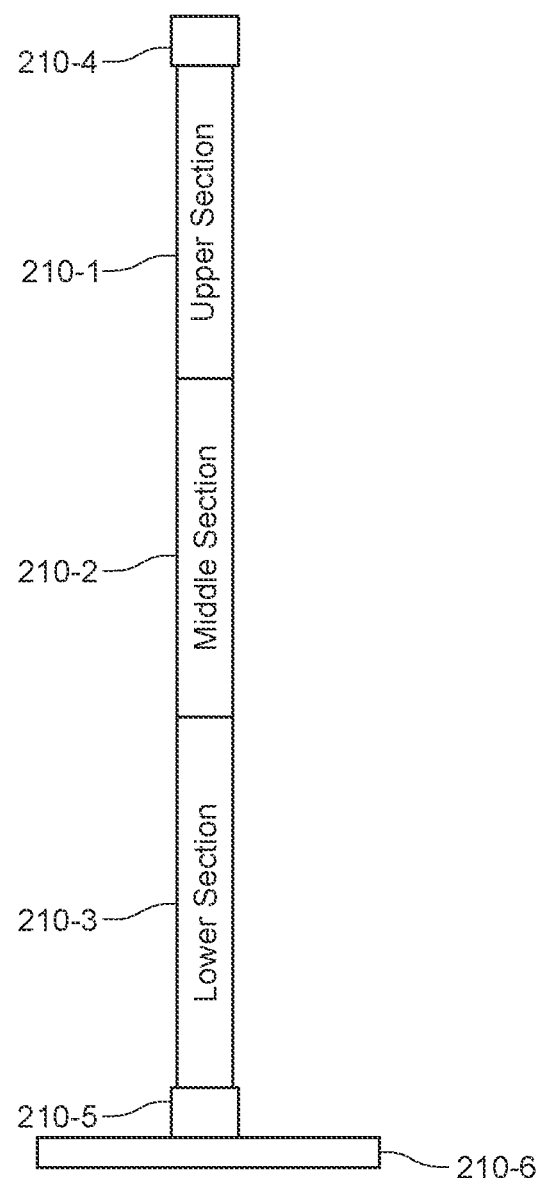
FIG. 2A depicts an exemplary construct of a security post, in accordance with an embodiment of the present teaching.

FIG. 2A depicts an exemplary construct of a security post 200, in accordance with an embodiment of the present teaching. As illustrated in this embodiment, the security post 200 is assembled using different sections, including an upper section 210-1, a middle section 210-2, and a lower section 210-3. In some embodiments, each section is a segmental-type cylinder body plus thread connection structure, as will be discussed with reference to FIGS. 3A-3C and 4B-4C. The security post 200 also includes an overall alarm light 210-4, which may have an annular shape or any other suitable shape. The security post 200 also include a base 210-5, which is attached to a stand 210-6. Although three different sections are shown in FIG. 2A, different configurations may also be implemented. For example, there may be two sections. As another example, there may be more than three sections. Specific implementations may depend on the situation that the security post is deployed. For instance, if the security post is used in a setting where people at different levels may pass through, the security post may be quite tall so that more sections may be assembled to detect metal/electronic objects that people at different levels may carry.

In general, a security gate is a metal detector. It relies on the principle of electromagnetic induction. That is, when alternating current passes through a coil, it generates a rapidly changing magnetic field. Such a magnetic field can induce, when a metal object is present, Eddy currents inside the metal object. Such induced Eddy currents may also generate magnetic fields, which in turn affect the original magnetic field caused by the coil. Such magnetic field variations may then be used to detect the presence of the metal object. In generating the magnetic field, it is generally use certain frequencies, e.g., 80-800 kHZ. Magnetic fields with different frequencies are known to be suitable for detecting different types of target objects. For instance, the lower the working frequency, the better the detection performance for iron based object. The higher the working frequency, the better the detection performance for objects with high carbon steel.

Figure 2B:
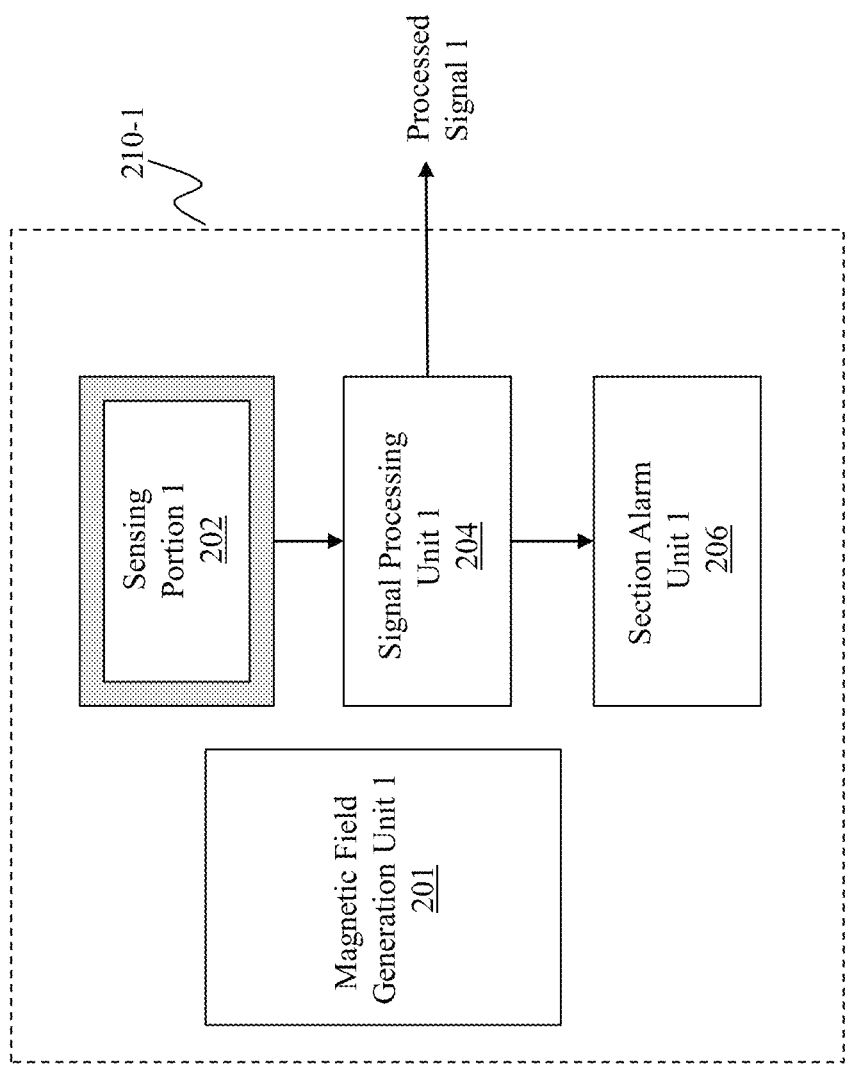
FIG. 2B depicts the high level system diagram of a section of a security post, in accordance with an embodiment of the present teaching.

In some embodiments, each of the sections is configured to independently detect metal or electronic object. FIG. 2B depicts a high level system diagram of one section, e.g., 210-1, of the security post 200, in accordance with an embodiment of the present teaching. To enable the detection, each section comprises some functional modules. As shown in FIG. 2B, a section includes a magnetic field generation unit 201, a sensing portion 202, a signal processing unit 204, and a section alarm unit 206. The magnetic field generation unit 201 is configured to generate an original magnetic field based on which variations thereof is to be detected. In some embodiments, depending on the application need, the magnetic field generation unit 202 may also generate more than one magnetic fields, each with different parameters such as working frequencies, in order to enable detection of different types of target objects.

The sensing portion 202 is provided to detect any variations of the original magnetic field and may include one or more sensors deployed for sensing the information related to changes to the magnetic field caused by, e.g., metals. Sensors to be used may be any sensors that can be used to detect information related to presence of metals or metal mixture. For instance, such sensors may include flux-gate sensor designed to detect existence of metal substances. Such sensed information may then be analyzed by the signal processing unit 204 located in the same section to determine whether a target object is present based on the sensed magnetic field variations. In the event that a target object is detected via signal processing, the section alarm unit 1 206 in section 210-1 triggers an alarm associated with the section.

Figure 2C:
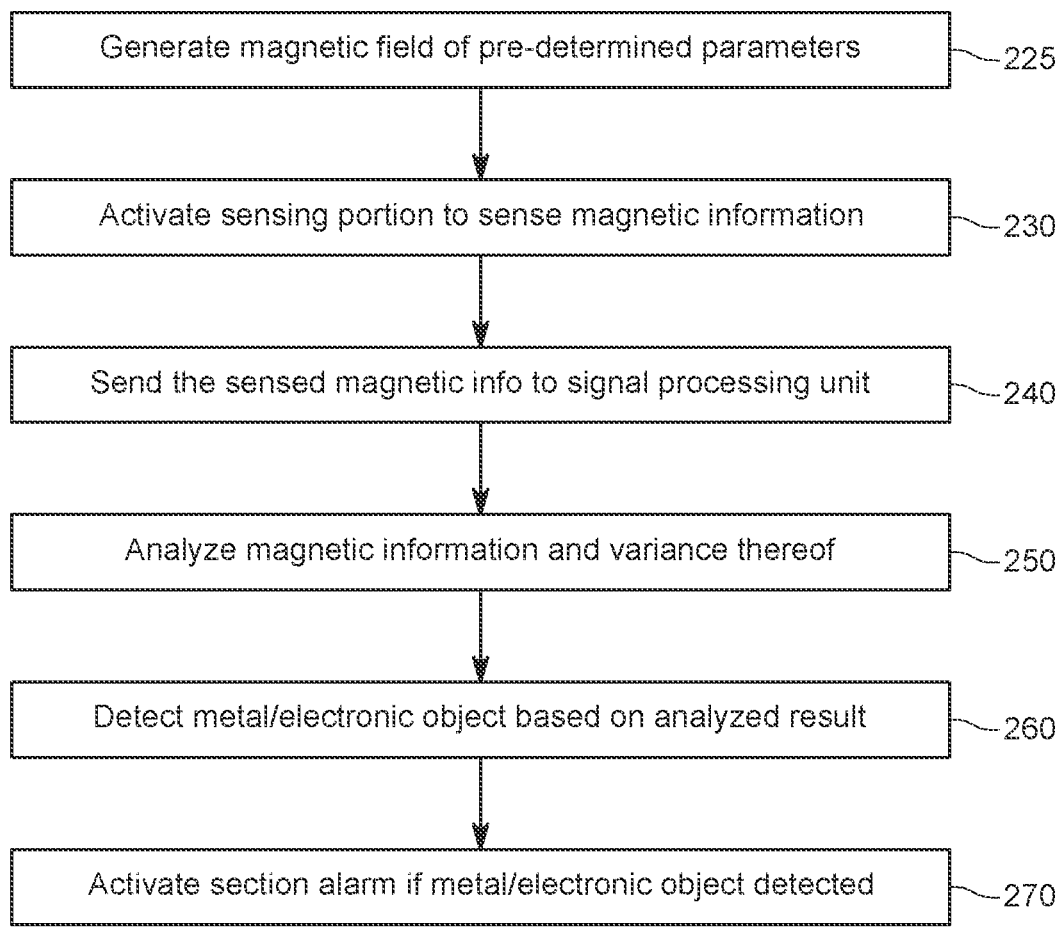
FIG. 2C is a flowchart of an exemplary process of a section of the security post, in accordance with an embodiment of the present teaching.

FIG. 2C is a flowchart of an exemplary process of a section of the security post 200, in accordance with an embodiment of the present teaching. To enable the detection, the magnetic field generation unit 201 is activated to generate, at 225, a magnetic field in accordance with some pre-determined parameters. Such parameters may include frequency, etc. and may be determined based on the needs of a specific application (e.g., particular type of target object to be detected). To detect a target object, the sensing portion 202 is activated, at 230, to sense information related to magnetic field variations caused by presence of metal substances. The sensed information may then be sent, at 240, to the signal processing unit 204. Upon receiving the sensed information, the signal processing unit 204 analyzes, at 250, the information associated with the magnetic field and variance thereof in order to determine, at 260, whether metal or electronic object is present based on the features detected from the sensed magnetic field variations. When it is determined that a metal and/or electronic object is present, the section alarm unit 206 is activated to trigger the section alarm as a report.

Although the illustrated embodiments have each section with its own magnetic field generation unit, it is also possible to have an overall magnetic field generation unit for the entire security post to generate a magnetic field that can be relied on by all sections of the security post. In some embodiments, it is also possible that a magnetic field generation unit may generate multiple magnetic fields, each with different parameters such as working frequencies and being used to a different group of object. Such multiple magnetic fields may be generated simultaneously or according to a time switched schedule so that different time periods during the time switched schedule, different magnetic fields are to be generated and used to detect designated groups of objects. When a time switched schedule is used, the signal processing units located in different sections may also be managed to operate synchronously in accordance with the time switched schedule to detect different target objects during such time slots.

Figure 2D:
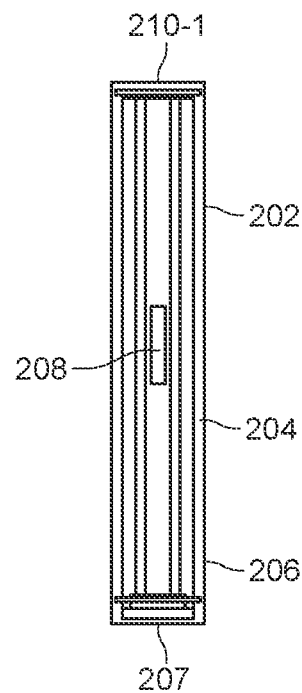
FIG. 2D shows an exemplary implementation of a section of a security post, in accordance with an embodiment of the present teaching.

FIG. 2D shows an exemplary implementation of a section of the security post 200, in accordance with an embodiment of the present teaching. In this exemplary implementation, the section shown is, e.g., the upper section 210-1, embedded with different parts such as the sensing portion 202, the signal processing unit 204, and the section alarm unit 206. Notably, the exemplary implementation also includes a section alarm 208, which may correspond to a light, a speaker, or a combination of both a light and a speaker so that when a metal/electronic object is detected, the section alarm unit 206 may trigger to activate the section alarm 208 to report the detected metal/electronic object. The section also includes a connecting structure 207 at the bottom, which may correspond to a male or female threaded joint to be connected to a matching female or male threaded joint of another section to form a solid connection. Depending on the configuration, when reporting a detection, the light may be turn on (which may be static or flashing), a particular sound may be broadcast (e.g., a siren), or a combination of both light and sound may be activated to report the detection.

Figure 2E:
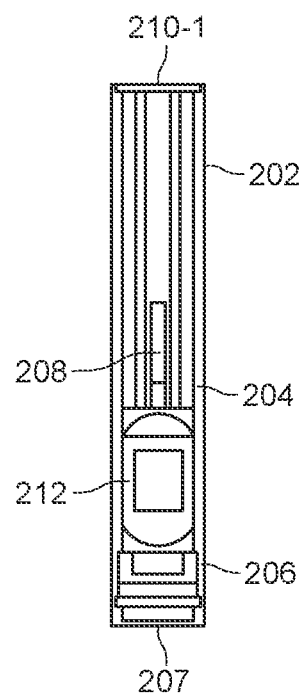
FIG. 2E shows an alternative implementation of a section of a security post, in accordance with an embodiment of the present teaching.

FIG. 2E shows an alternative implementation of a section of the security post 200, in accordance with an embodiment of the present teaching. As discussed herein, what is shown is the upper section 210-1. In this embodiment, in addition to the sensing portion 202, the signal processing unit 204, the section alarm unit 206, and the alarm light 208 implemented therein, there is also a touchable display screen 212 implemented on the upper section. This touchable display screen may provide an interface for displaying detection result to a user (e.g., an TSA officer at an airport) and allowing the user to specify, via the touch screen, various parameters to be used to operate the security post. For example, the interface may be used to display the detection results from different sections in a certain form. For instance, an interface may be configured to display the most significant detection result associated with a particular section. It may also be set to display detection results of all sections at the same time. There may be various layout forms available to display detection results and a user may elect to use one of the layout for showing the detection results. Although in the illustrated embodiment as shown in FIG. 2E, the touchable display screen is provided on the upper section 210-1, it may also be implemented on a different section of the security post.

The display screen may also serve as an interface to allow a user to interact with the detection system to specify operational parameters. Some of such parameters may be used in detection, e.g., the sensitivity in detecting a metal/electronic object. Some of such parameters may also related to how to alarm a user of detected metal and electronic objects. For instance, different colors may be specified for the section alarm to show different types of detection results or different degrees of, e.g., certainty in the detection result. Parameters dictating the loudness of the alarm based on the confidence in the detection results, etc.

Figure 3A:
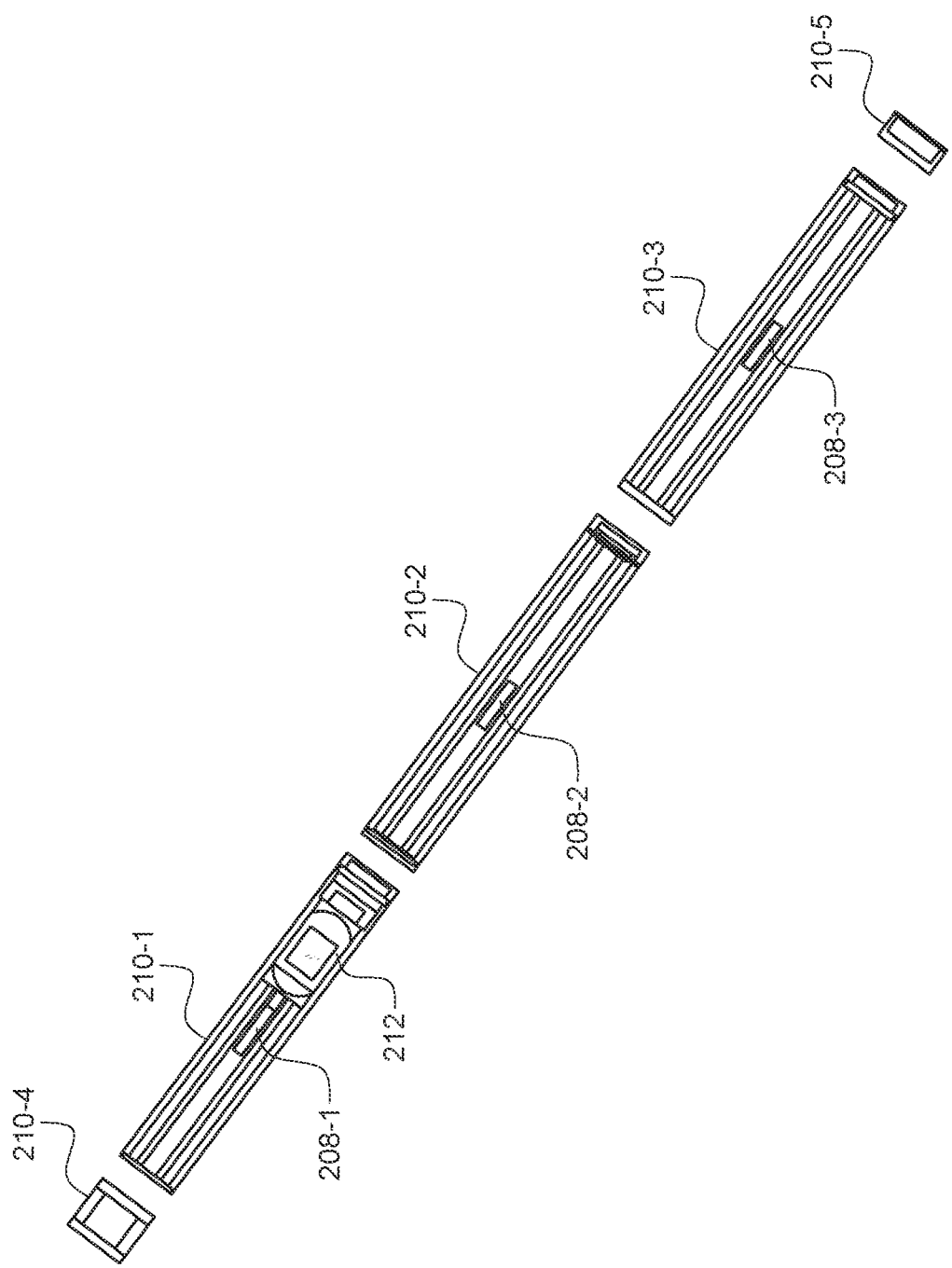
FIG. 3A shows an exemplary configuration of different parts of a security post, in accordance with an embodiment of the present teaching.
Figure 3B:
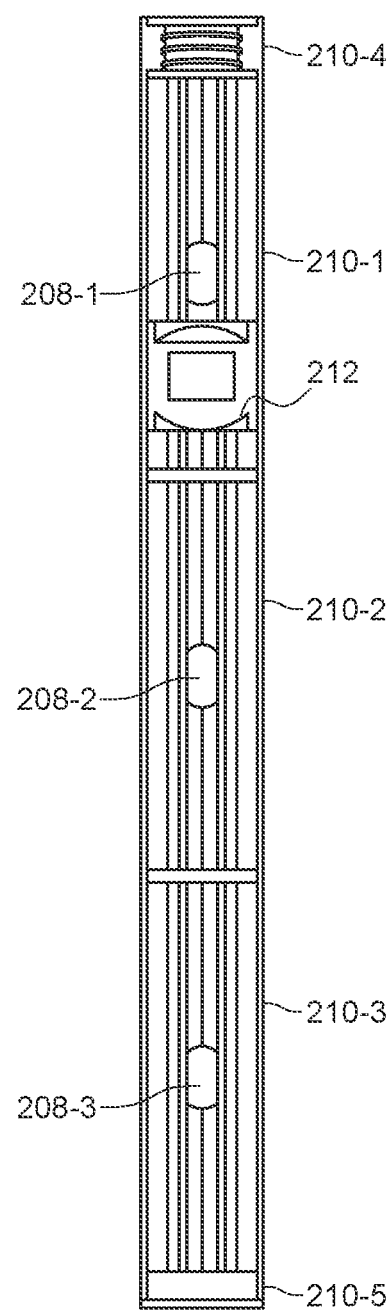
FIG. 3B shows an exemplary assembly of different parts of a security post, in accordance with an embodiment of the present teaching.
Figure 3C:
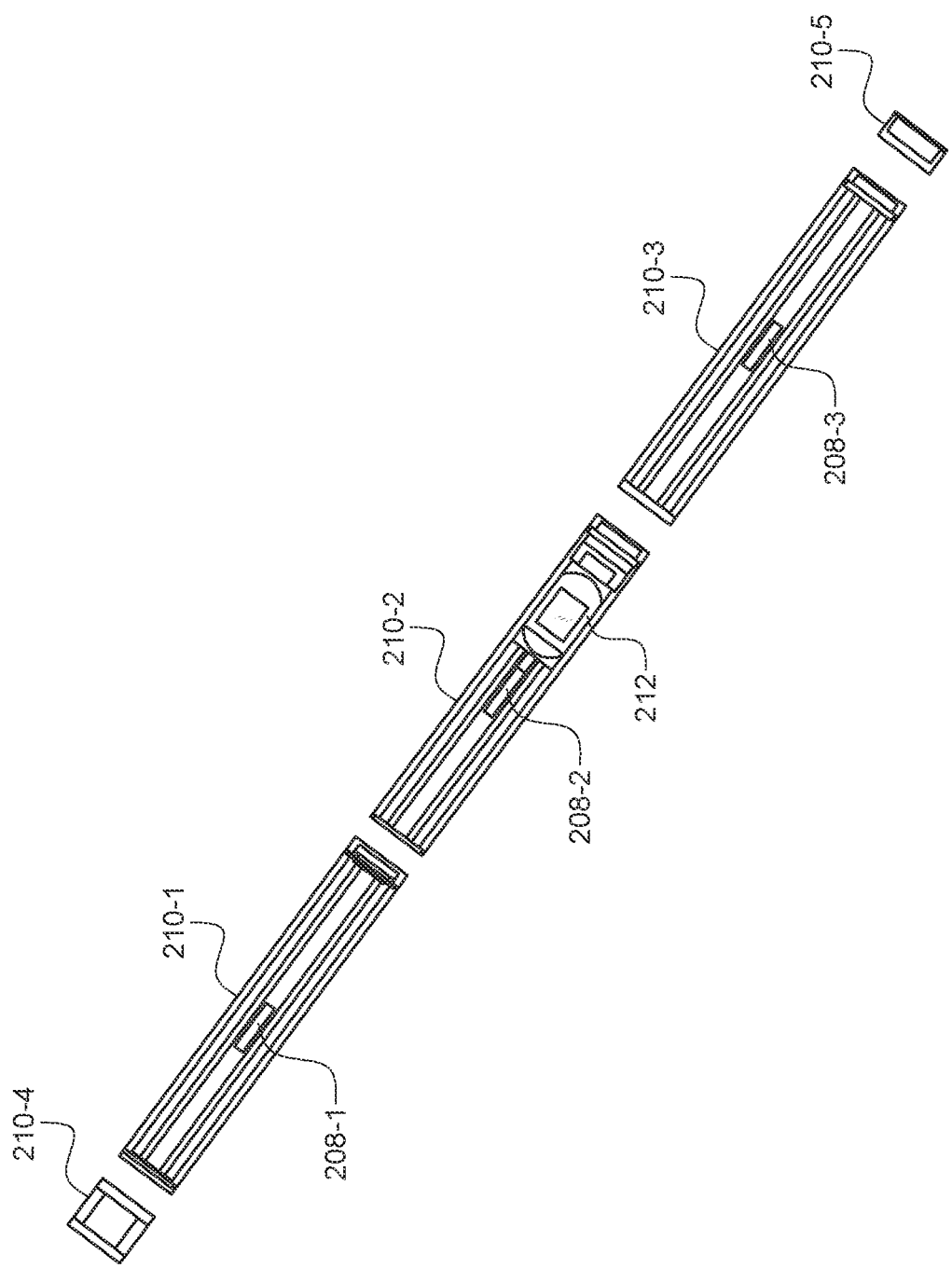
FIG. 3C shows an alternative configuration of different sections of a security post, in accordance with an embodiment of the present teaching.

Individual sections of the security post 200 as disclosed herein may be separately made and then assembled to construct the post 200. FIG. 3A shows different parts of the security post 200 made separately, in accordance with an embodiment of the present teaching. As seen, each part is an individually made article and they can be connected using, e.g., exemplary male/female threaded joints, as disclosed in FIGS. 4A-4C. FIG. 3B shows an exemplary security post 200 by assembling different parts together using the connecting structures (such as male/female threaded joints) as shown in FIG. 3A, in accordance with an embodiment of the present teaching. FIG. 3C shows an alternative arrangement of different sections of the security post 200, in accordance with an embodiment of the present teaching. As seen, the difference between FIG. 3A and FIG. 3C is that the touchable display screen is on the upper section 210-1 in FIG. 3A but on the middle section 210-2 in FIG. 3B. In the illustrated embodiments, each section is a cylinder body with threaded connection structure that securely joins adjacent cylinder bodies together. Such embodiment is merely for illustration rather than for limiting purposes. Other structures for each section may also be used and accordingly corresponding connecting structures may also be appropriately deployed to securely tie adjacent sections together to form a security post consistent with the present teaching.

Figure 4A:
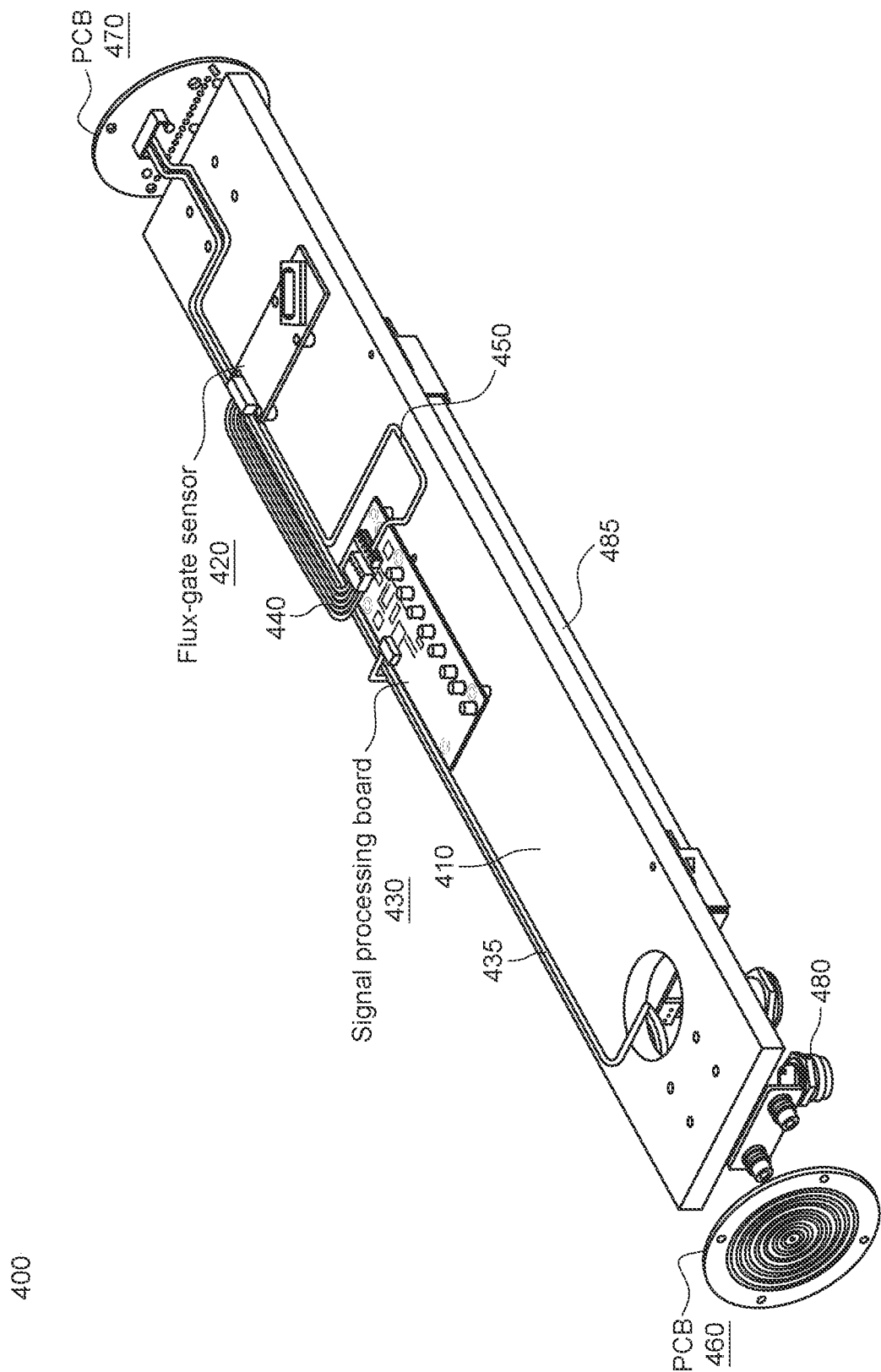
FIG. 4A shows an exemplary internal implementation of a section of a security post, in accordance with an embodiment of the present teaching.

FIG. 4A shows an exemplary internal implementation 400 of a section of the security post 200, in accordance with an embodiment of the present teaching. The exemplary implementation 400 is deployed inside each of the sections of the security post 200 and includes implementations of different functional modules as disclosed in FIG. 2B. Specifically, the implementation 400 comprises a board 410 with various parts implemented thereon to achieve the functionalities corresponding to the sensing portion 202, signal processing unit 204, and section alarm unit 206. As shown, as an example, there includes flux-gate sensor 420, a signal processing board 430, there are installed one or more sensing means such as flux-gate sensors 420, a signal processing board 430 implementing the functions of the signal processing unit 204, and sectional alarm 485. There are also wires 450 connecting the flux-gate sensor 420 and the signal processing board 430 and to an adjacent section via the PCB board 470 to enable transmission of signals within or between sections. There are also other power supply lines 435 that deliver power supply to different parts on the board 400 and to an adjacent section via the PCB board 470. On one end of the board 410, there are connectors 480 that are used to connecting PCB board 460 which connects to another adjacent section to receive supply via connecting structure to be discussed in detail with reference to FIGS. 4B-4D.

Figure 4B:
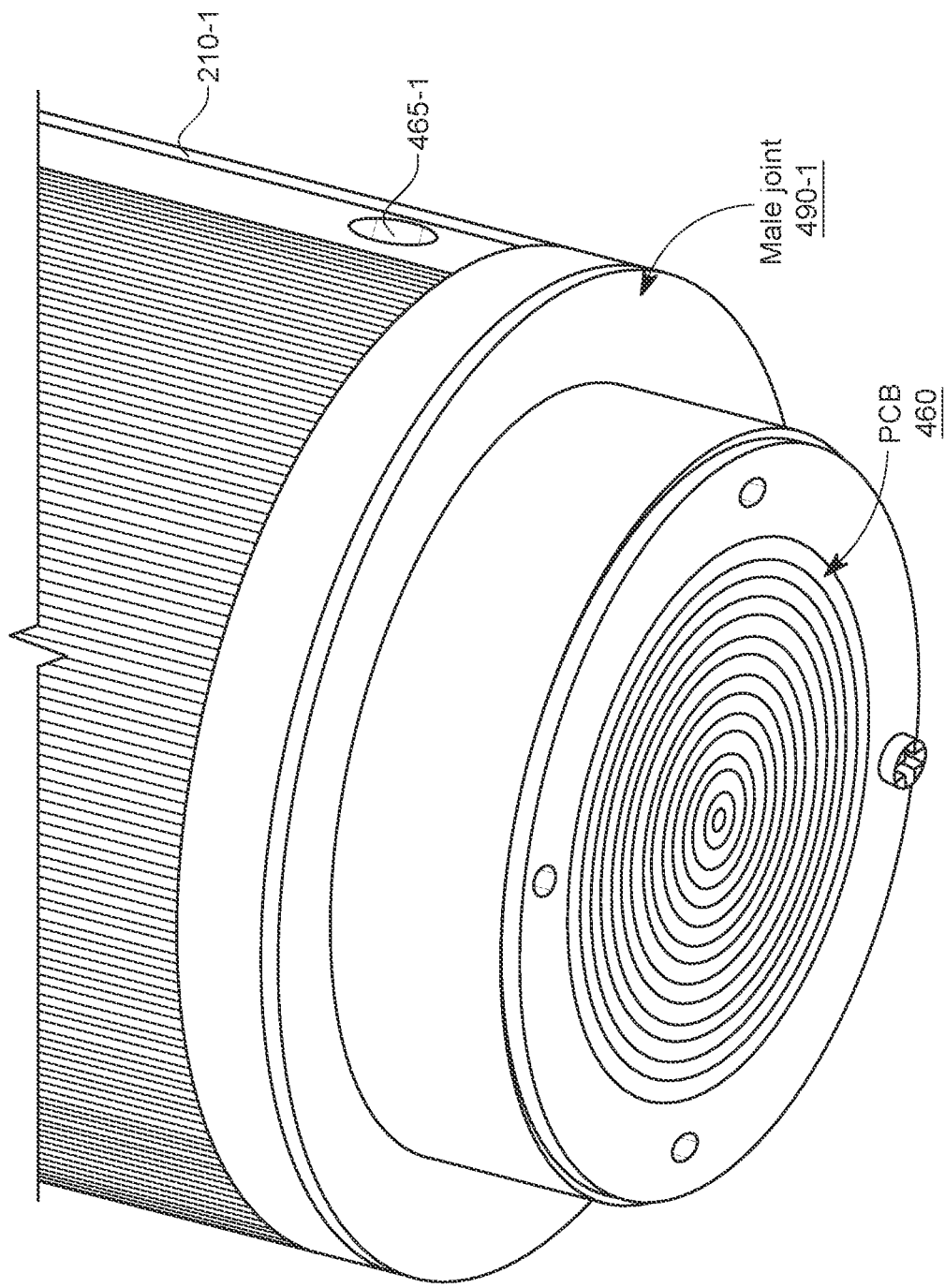
FIGS. 4B-4D illustrates an exemplary implementation for attaching adjacent sections of a security post, in accordance with an embodiment of the present teaching.
Figure 4C:
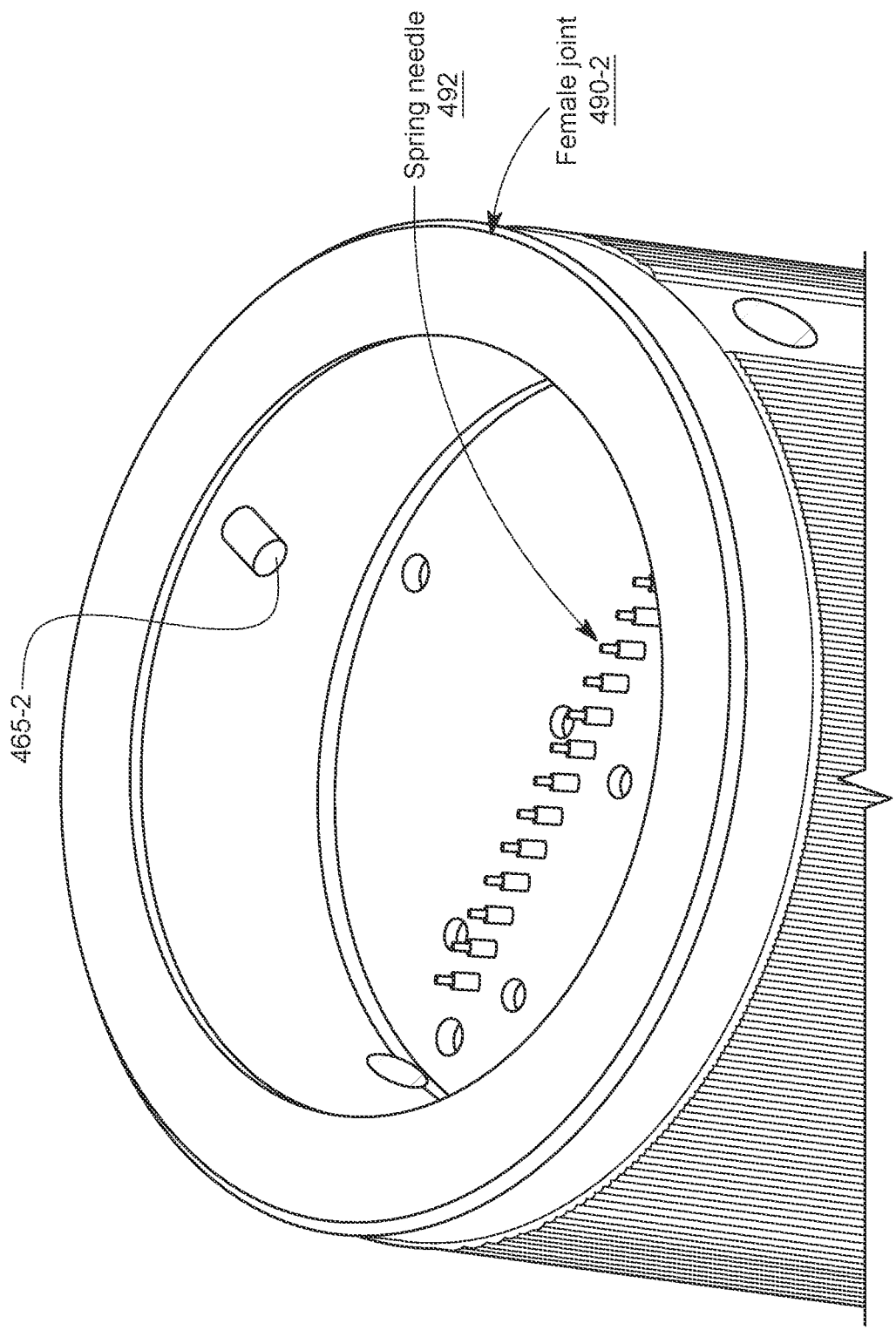
Figure 4D:
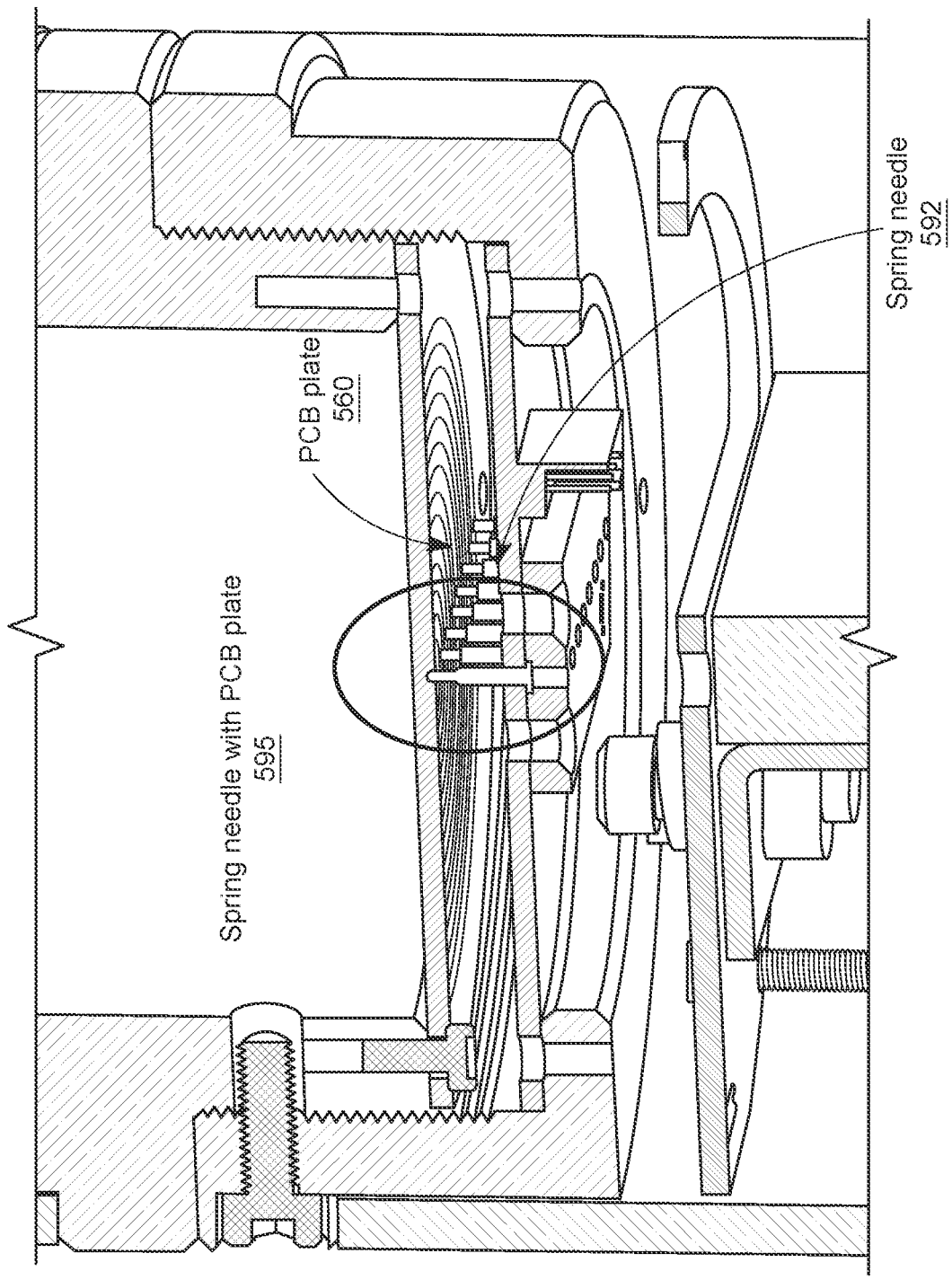

FIGS. 4B-4D illustrates an exemplary implementation for connecting structure for attaching adjacent sections of the security post 200, in accordance with an embodiment of the present teaching. FIG. 4B shows the PCB board 460 (also in FIG. 4A) of a section 210-1 attached to the section via, e.g., the connectors 480. To connect section 210-1 to another section, section 210-1 has a male joint 490-1 that is to be matched with a female joint 490-2 in FIG. 4C. When the male joint 490-1 in section 210-1 is matched with female joint 490-2 of an adjacent section, the conductive concentric circles on the PCB board 460 touch the spring needles 492 shown in FIG. 4B. It is through such spring needles 492 and the conductive connection circles on the PCB board 460, the power supply and other signals are delivered and transmitted from the connected section to section 210-1.

In some embodiments, in addition to the male and female joints connecting the two sections, there are additional means to secure the connection of two adjacent sections. For example, in FIG. 4B, there is a hole 465-1 through which a secure means such as a nail may be nailed in to secure the connection of the two sections. Through this hole, when a secure means is used (e.g., nailed in), the secure means may protrude inside of the female joint 490-2, as 465-2 in FIG. 4C. That is, the connecting structure of the base 207 and each section of the security post applies the male/female threaded joints connecting structure. The electric connections between sections are made by spring ejector plus annular PCB board. This is shown in FIG. 4D. Each section has a sectionalized structure. That is, it applies the nested serial connection structure externally pre-installed electric board. Sectionalized body of the security post and the terminal joints between adjacent sections ensures maximum structural rigidity and tightness of the joints.

Figure 5A:
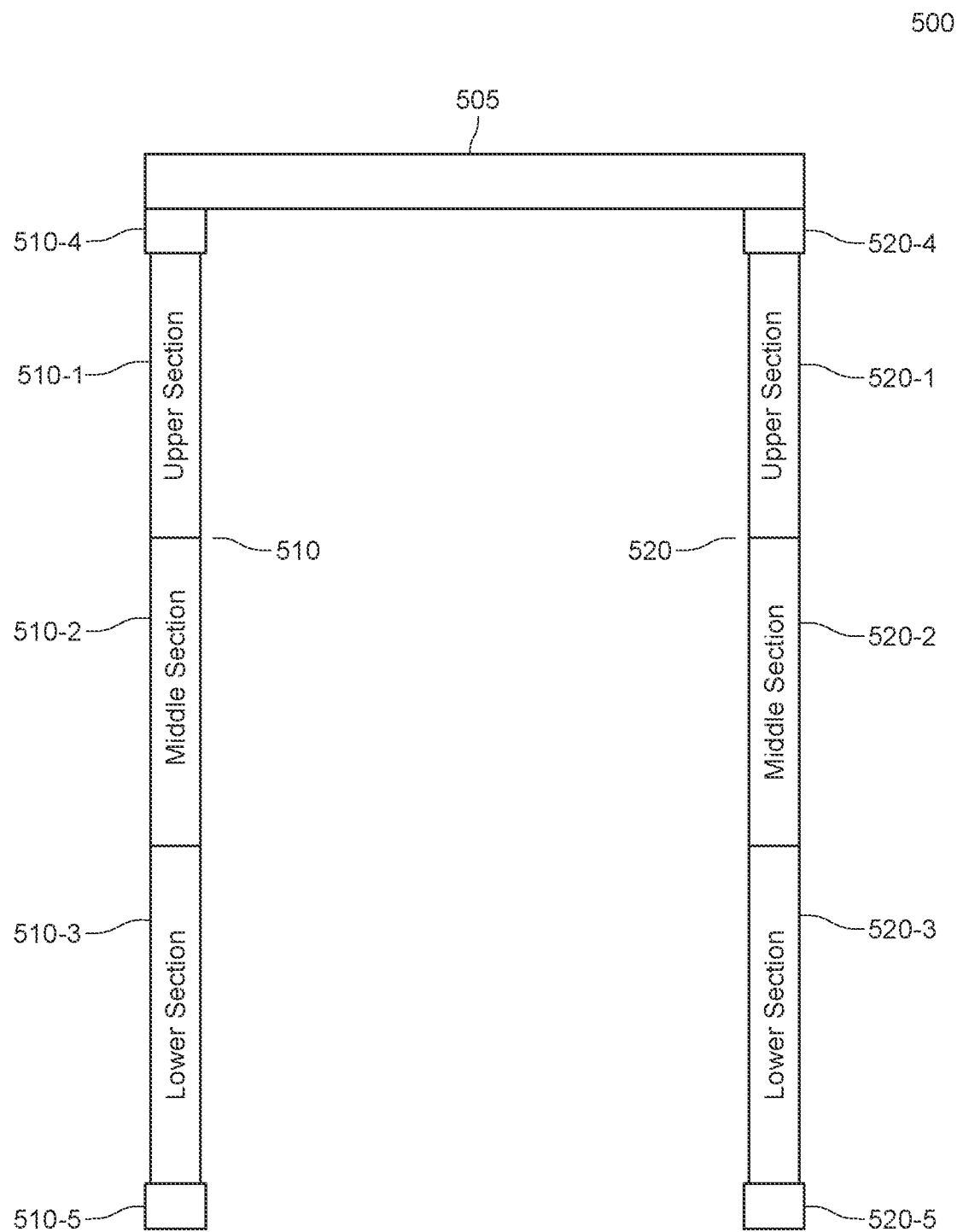
FIGS. 5A-5E depict exemplary deployments of security post(s), in accordance with an embodiment of the present teaching.

The security post 200 as disclosed herein may be used in different applications. It can be either deployed as is as a post or can be used to form a security gate in different ways. FIGS. 5A-5E depict exemplary deployments of security post(s), in accordance with an embodiment of the present teaching. In FIG. 5A, a security gate 500 is constructed using two security posts 510 and 520 and a top structure 505. Each of the security posts 510 and 520 is similarly structured with multiple sections. As illustrated, the security post 510 has an upper section 510-1, a middle section 510-2, and a lower section 510-3, an overall alarm 510-4, and a base 510-5. Similarly, the security post 520 has an upper section 520-1, a middle section 520-2, and a lower section 520-3, an overall alarm 520-4, and a base 520-5. When a person passes through the security door, at least some of the sensing portions in different sections of the security posts 510 and 520 sense the information relevant for detecting metal/electronic objects and send such sensed information to their corresponding signal processing units for detecting signal signatures of metal and electronic objects. If a section in a security post detects the presence of a metal or an electronic object, the section alarm unit may trigger a local alarm located in the section so that it provides an indication of the locale of the detected object. The overall alarm may also be triggered to indicate a detection of a suspect object.

Figure 5B:
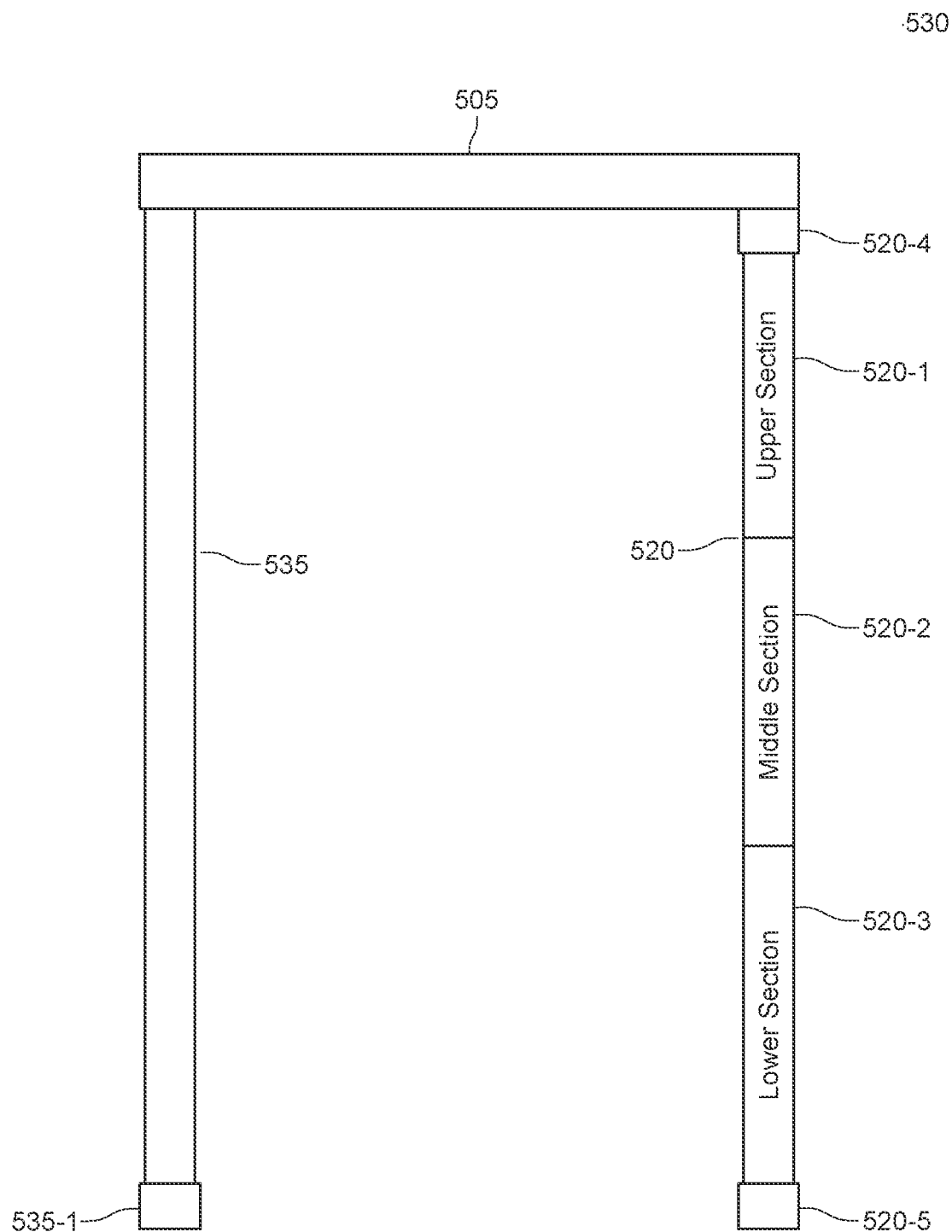
Figure 5C:
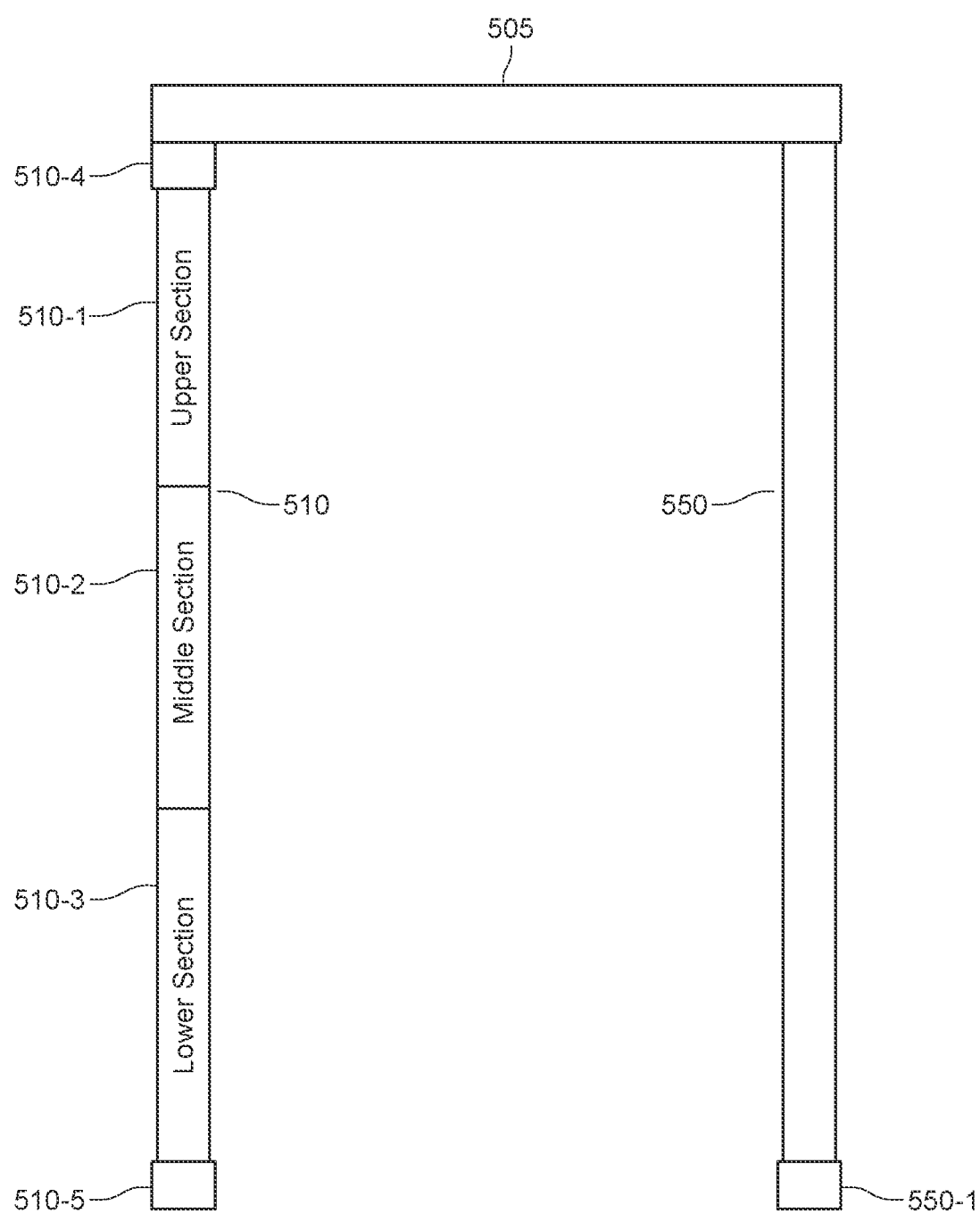
Figure 5D:
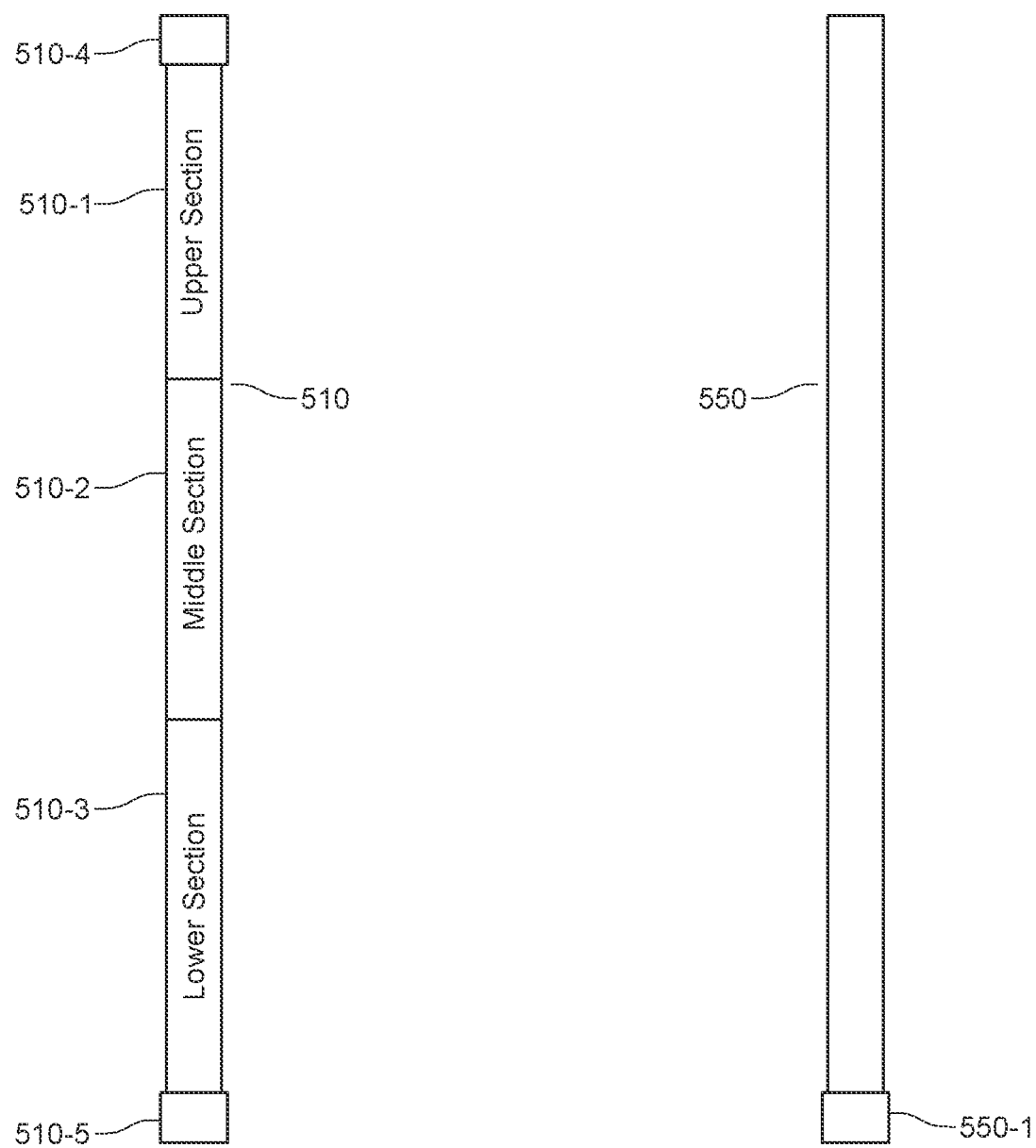

FIGS. 5B-5C show different configurations of a security door, in accordance with an embodiment of the present teaching. In these embodiments, a security door 530 is constructed using one security post on one side with the other side simply a post without detection means and alarm. FIG. 5B shows an exemplary security door 530 with a single security post 520 used on the right and a normal post 535 with a base 535-1 on the left. FIG. 5C shows another exemplary security door 540 in an opposite configuration having a single security post 510 used on the left and a normal post 550 with a base 550-1 on the right. Both of these configurations have a top 505 to form a security door. In some embodiments, the top 505 may be omitted so that two posts on two sides may form a security checking path (without the top). Any of the exemplary security doors 500, 530, and 540 as shown in FIGS. 5A-5C may also have a corresponding variation of security paths without the top 505. One example security path 560 shown in FIG. 5D is configured based on the security door 540 with the top 505 removed. In some embodiments, the post without the means for detecting metal/electronic object may also be equipped with devices therein for detecting other substance/object so that such formed security door or security path may be configured to detect multiple types of objects/substances carried by a person passing through the door/path.

Figure 5E:
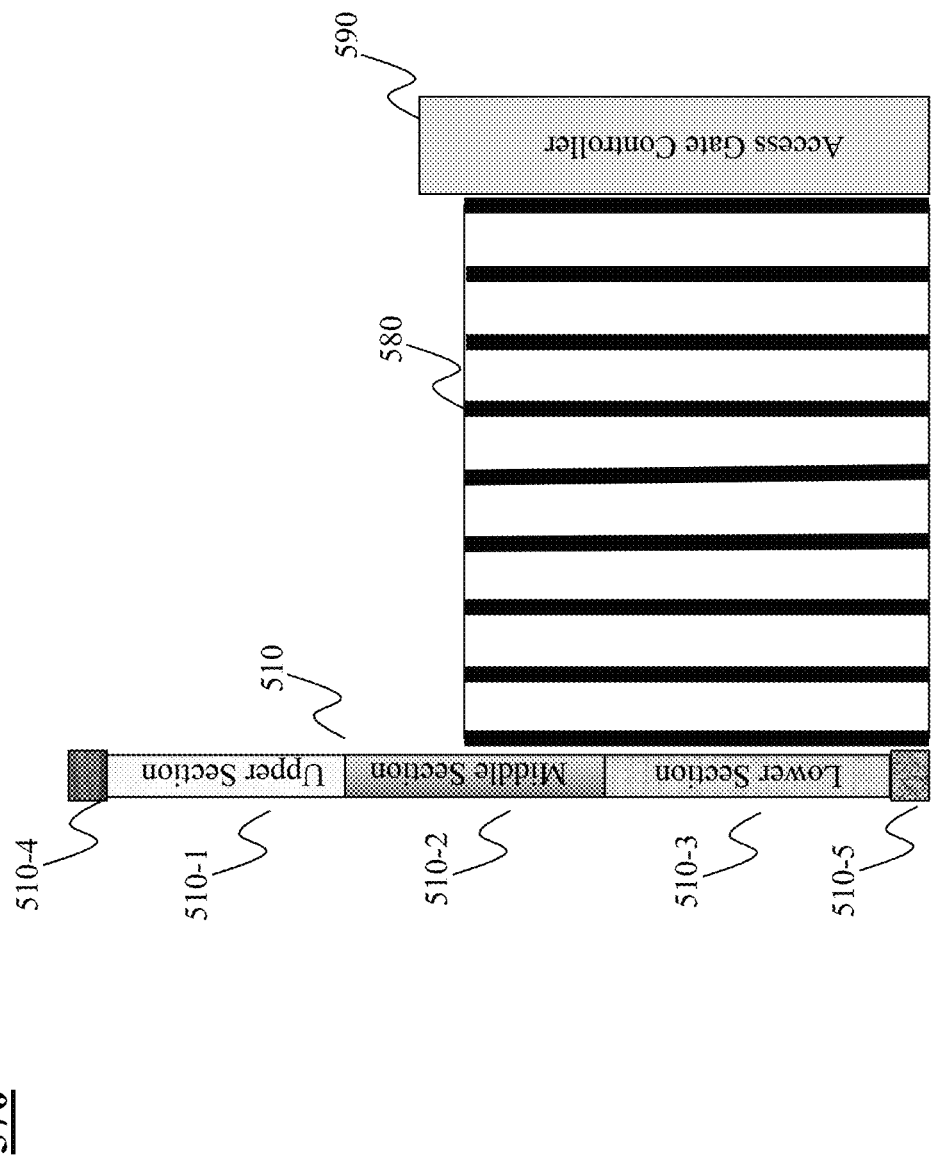

FIG. 5E shows yet another use of a security post, in accordance with an embodiment of the present teaching. In this illustrated embodiment, the security post 510 is used in connection with an access gate controller 590 to control the access via a gate 580 based on detection result from the security post 510. In this use, when a person intending to pass the gate 580 approaches the gate 580, the security post 510 detects whether the person carries or hides a metal or electronic object. In the event that no metal/electronic object is detected from the person, the security post 510 may wirelessly inform the access gate controller 590 that may then control the gate 580 to open to allow the person to pass through. On the other hand, if a suspected object is detected, either a metal or an electronic object, the security post 510 informs the access gate controller 590 so that it will not open the gate 580 to deny the access of the person.

Figure 6A:
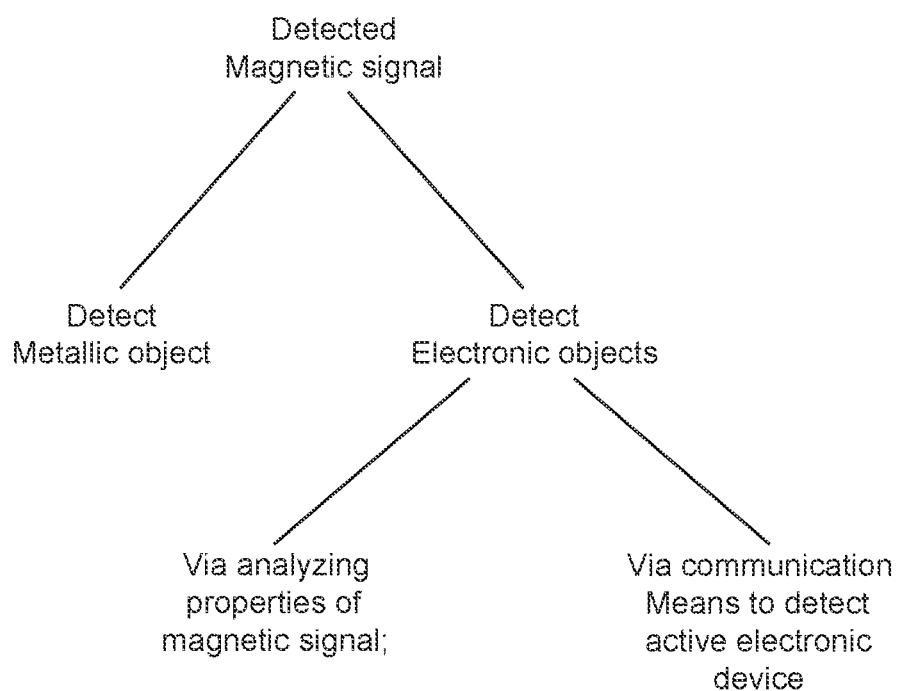
FIG. 6A shows types of objects to be detected using a security post and means to detect them, in accordance with an embodiment of the present teaching.

Various embodiments of the security post in terms of physical construct or composition have been discussed herein. The discussions below are directed to functional aspects of the security post to achieve the intended purposes of detecting metal and/or electronic objects. FIG. 6A summarizes types of objects to be detected using a security post and means to detect them, in accordance with an embodiment of the present teaching. The types of objects to be detected in accordance with the disclosure include metallic and electronic objects. The detection of both types of objects is based on magnetic information sensed when a person passes by. As to the detection, the existence of metal substances with complex compositions can be detected based on the magnetic field variance caused by metal. Comparing metal and electronic objects, a metal object may present a substantial amount of metal while an electronic object may have metal mixed with other substances so that the level is much lower. For example, an electronic device may have limited parts that have metal present, e.g., coils, the metal lines in a circuit board, etc. So, a key to distinguish a metal object from an electronic object is to detect the difference in magnetic field variance caused by the metal present. This is achieved by analyzing the properties or signatures of magnetic field variance caused by the presence of metal, either in a metal object or in an electronic object. This is listed in FIG. 6A as one way to detect an electronic object. Another alternative approach to detect an electronic object is via a communication means, as shown in FIG. 6A. This approach is to be used to detect an electronic object or device that is on. Details of detecting such intended objects are discussed in detail below.

Figure 6B:
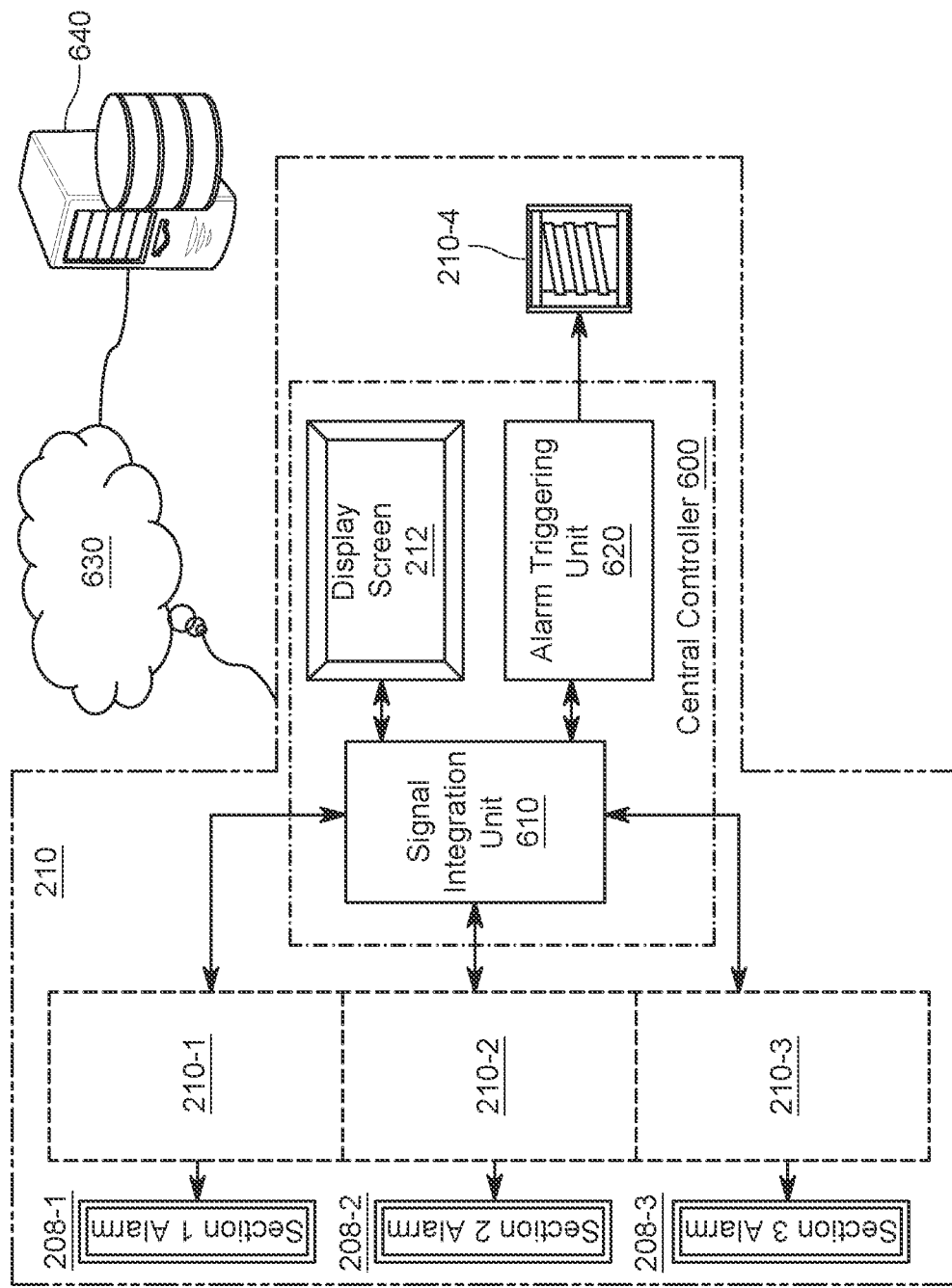
FIG. 6B depicts an exemplary high level diagram of a security post in connection with a server via network connections, in accordance with an embodiment of the present teaching.

FIG. 6B depicts an exemplary high level system diagram of a security post 210 in connection with a server 650 via network connection 640, in accordance with an embodiment of the present teaching. In this illustrated embodiment, the security post 210 comprises a number of sections, e.g., sections 210-1, 210-2, and 210-3, section alarms (i.e., section 1 alarm 208-1, section 2 alarm 208-2, and section 3 alarm 208-3) associated with their corresponding sections, a central controller 600, and an overall alarm 210-4. As discussed herein, either each section includes its own magnetic field generation unit (as shown in FIG. 2B) or there is one overall magnetic field generation unit (not shown). In some embodiments, each section in the security post 210 detects, independently, for presence of metal and/or electronic object. If a section detects a target object, the section alarm unit of that section triggers its associated section alarm. In some embodiments, each section may gather information sensed by sensors located in that section and processed the sensed information and send such processed information to an overall signal processing unit where the information from different sections may be integrated in order to make an overall determination about presence of target objects.

The central controller 600 handles operations at the level of the security post. It comprises a signal integration unit 610, a display screen 212 (see FIGS. 3A-3C), and an alarm triggering unit 620. Each section may send its detection result or processed information to the signal integration unit 610, which integrates the sectional result and determines whether a target object is detected. When a target object is detected, the signal integration unit 610 may activate the alarm triggering unit 620 to set off the overall alarm 210-4. In some embodiments, each section may be flexibly configured to either simply processing the sensed information to forward on or to determine, e.g., whether metal is present in the vertical range designated to the section and whether the detected object is from a metallic object or an electronic object. When the signal integration unit 610 is to make a determination of a target object, the information from different sections may be integrated for assessing whether there is a metallic or an electronic object and where it is present based on, e.g., a detailed analysis of the magnetic field variance. In some embodiments, the signal integration unit 610 may also serve as a controller for interface with the display screen 212 to receive operational parameters such as sensitive level specified by a user and to transmit such operational parameters to different sections to facilitate their respective operations.

In some embodiments, a security post, either operating alone or in a bigger structure such as a security door, may operate as a distributed unit and be connected with a server located elsewhere, the security post may transmit its detection results to the server. This may be in addition to logging the detected events in its own local storages (not shown). In this case, the signal integration unit 610 may transmit, via a network 630, certain information to a server 640. In some embodiments, in addition to detection results on metallic objects or electronic objects, other types of information associated with the person carrying the detected metallic or electronic device may also be sent to the server after such information is acquired. Details on that will be provided with reference to FIGS. 7A-8B.

Figure 6C:
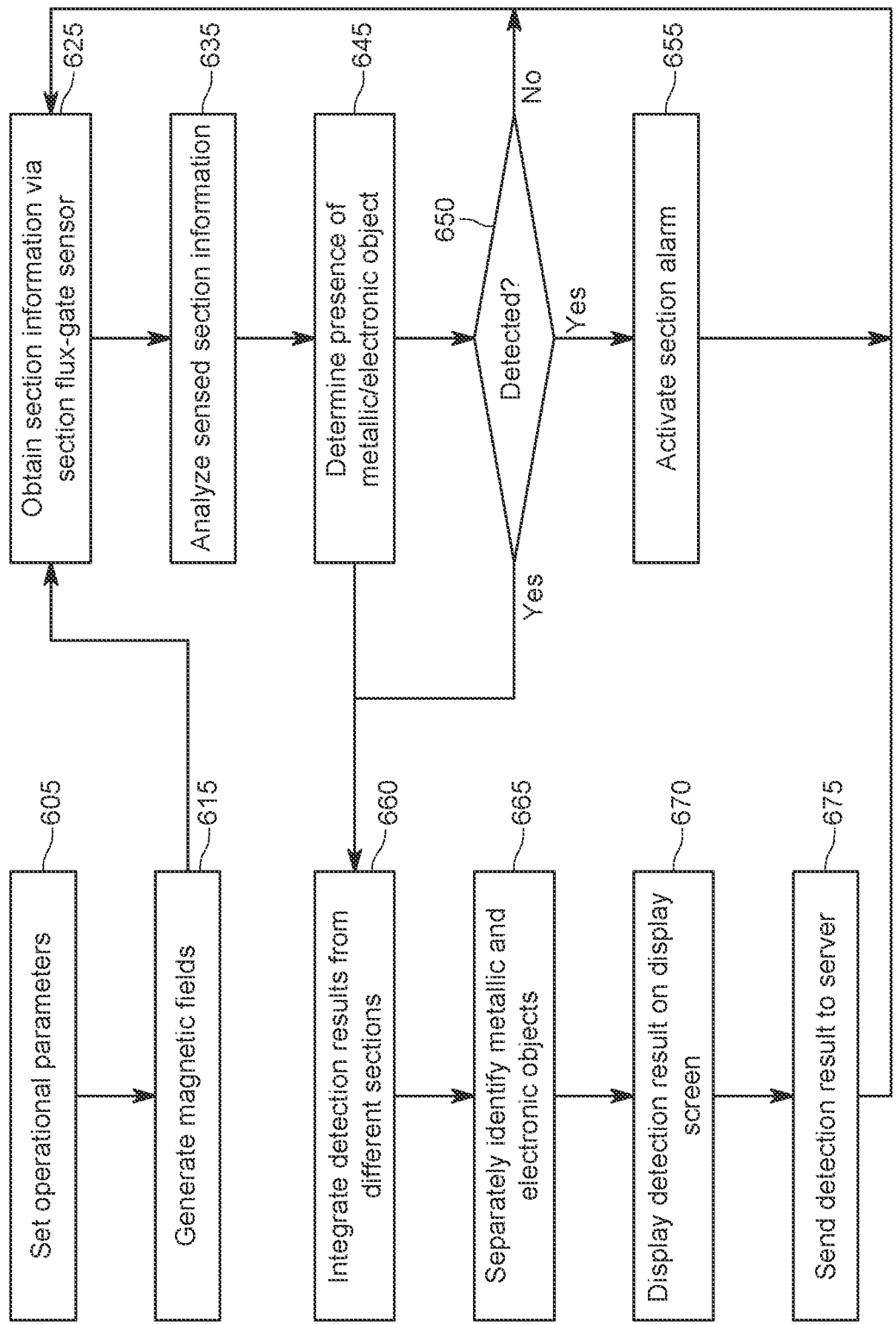
FIG. 6C is a flowchart of an exemplary process of a security post, in accordance with an embodiment of the present teaching.

FIG. 6C is a flowchart of an exemplary process of an exemplary security post 210, in accordance with an embodiment of the present teaching. First, the operational parameters for the security post are set or specified, at 605, e.g., working parameters to be used to generate the magnetic fields and/or a sensitivity level to be used in assessing whether metal is present or whether the magnetic field variance observed corresponds to a metallic or an electronic object to be used in an analysis of the sensed signals. With the operational parameters set, the magnetic field(s) are generated, at 615, based on the working parameters. In operation, the sensing portions in different sections in the security post obtain, at 625, sensed information from, e.g., flux-gate sensors. Such sensed information is sent to the signal processing unit which then analyzes, at 635, the sensed information and determine, at 645, the presence of metallic/electronic object based on the signal processing. If no metal is detected, determined at 650, i.e., no metallic/electronic object detected, the operation proceed to the next determination by going back to step 625.

If a section detects a metallic or an electronic object, determined at 650, the section activates, at 655, the corresponding section alarm to report the detection. Each section sends their respective detection results (e.g., whether the detection is positive or negative) to the central controller 600, where the signal integration unit 610 integrates, at 660, the detection results from different sections. As discussed herein, in some embodiments, the central controller 600 may separately identifies, at 665, whether a metallic and/or electronic object is present. In some embodiments, what is sent from each section may be the sensed information (rather than the detection result—see the link between 645 and 660) to the central controller 600 so that the detection is done at the signal integration unit 610 based on sensed information from different sections. In some embodiments, what is sent from each section to the central controller 600 may be the individually detection results (see link between 650 and 660). In some embodiments, the sections may send both the sensed information and the detection results to the central controller for integrated processing.

With the detected metallic/electronic object, the signal integration unit 610 controls to display, at 670, the detection result on the touchable display screen 212. As discussed herein, in some embodiments, the central controller 600 may send, at 675, the detection results to a server 640 via network 630. This option may be elected based on applications that the security post is deployed. For example, an application may involve different access points where security posts are deployed and a central control site to gather detection information from all the deployed posts. Specific applications involving this kind of setup may include access control at a corporation where there are multiple access points at different entry/exit points with a central monitor facility to consolidate the detection information from such entry/exit points.

In some embodiments, the detection of existence of metal is based on observed magnetic field variations caused by the presence of an object with metals therein. Different types of objects may have different levels of metals. For example, a metallic object such as a knife has a high level of metal while an electronic object may have a substantially lower level of metal, e.g., metal may exist only in limited areas in a smart phone (for example, only in pins, transformers, PCB board, or in chips). Different levels of metals present in different types of objects may cause different variations in the magnetic field. The observed magnetic field variations caused by presence of each type of objects may be analyzed, quantitatively characterized, and then used to classify some later observed magnetic field variations to see if similar type of object is causing the later observed magnetic field variations.

Figure 6D:
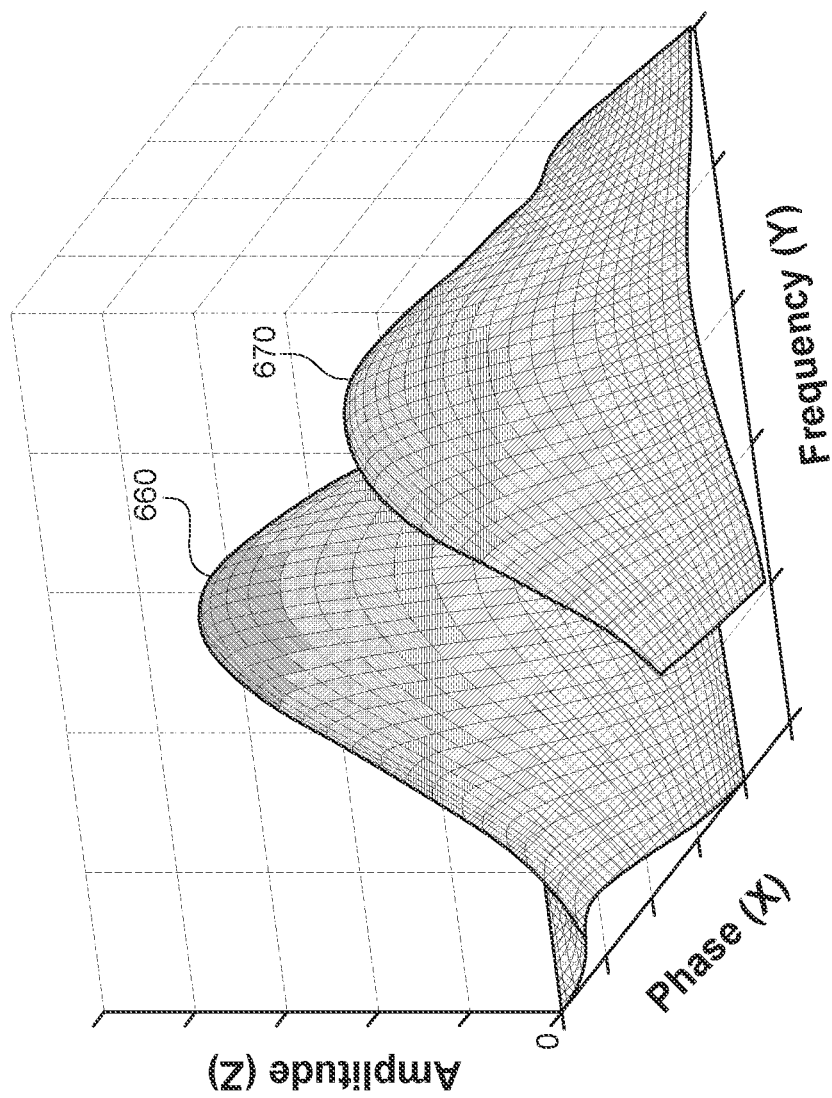
FIG. 6D is an exemplary distributions characterizing magnetic field variations caused by presence of a metallic object and an electronic object.

In some embodiments, to characterize magnetic field variations, different measures are used, e.g., the amplitude, the phase, and the strength of the variations. FIG. 6D illustrates exemplary distributions 660 and 670 characterizing magnetic field variations caused by presence of metallic objects and electronic object, respectively. In this illustration, X axis my represent the phase of observed signals, Y axis may represent the frequency of the observed signal, and the Z axis may represent the amplitude of the observed signal. In this illustration, the two exemplary distributions 660 and 670 are substantially distinct, one (e.g., 660) characterizing the distribution of observed magnetic field variations caused by presence of metallic objects and the other (e.g., 670) characterizing the distribution of observed magnetic field variations caused by presence of electronic objects. As the two illustrated exemplary distributions 660 and 670 are substantially distinct, they each provide a basis for modeling the characteristics of magnetic field variations caused by presence of a corresponding type of object. In some embodiments, each of these exemplary distributions may be modeled parametrically to enable future classification of object type (e.g., metallic or electronic objects) based on observed magnetic field variations. If a person passing the security post has neither a metallic nor an electronic object therewith, the magnetic field variation may not be observed or at least is at such a negligible level that it is distinguishable from either the distribution representing the magnetic field variations caused by a metallic object or that representing the magnetic field variations caused by an electronic object.

The distributions corresponding to different types of objects may be used to generate models via, e.g., machine learning based on training data acquired from historic detections. Upon the distributions 660 and 670 being quantitatively modeled via learning, appropriate criteria to be used for classifying a future observation to any of the classes modeled (i.e., metallic object or an electronic object) may be derived. Taking the example shown in FIG. 6D, the two distributions 660 and 670 may be divided using some, e.g., thresholding criteria in the feature space derived to, e.g., minimize the classification error rate. Such criteria may be represented by an exemplary surface 680 as shown in FIGS.

Figure 6E:
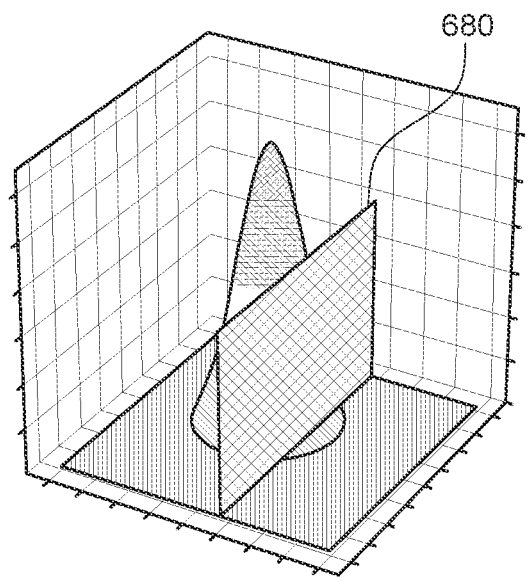
FIGS. 6E-6F illustrate exemplary thresholding criteria for classifying metallic and electronic objects, in accordance with an embodiment of the present teaching.
Figure 6F:
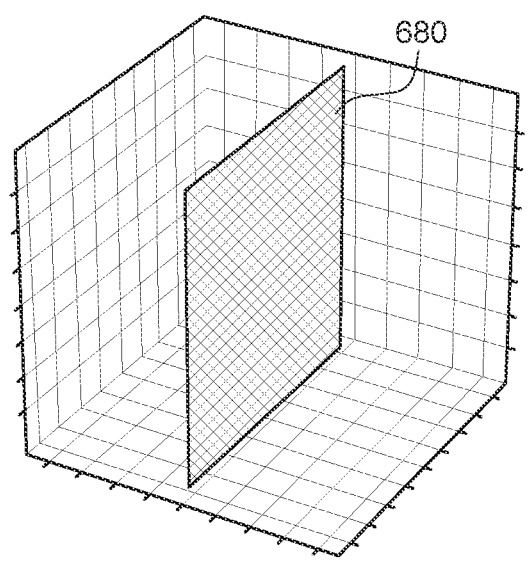

6E and 6F. It is noted that the exemplary thresholding surface 680 may appear to be linear. However, the criteria learned to serve as a dividing boundary between the two exemplary models characterizing the two exemplary distributions may be in any other form such as a nonlinear surface. In addition, although the exemplary distributions shown in FIGS. 6D-6F are in a three-dimensional feature space, they are merely for illustration purposes and do not serve as limitations. In general, features derived from the sensor data related to magnetic field variations may be in a feature space of any dimension.

The system diagram of a security post and the corresponding operational flow as depicted in FIGS. 6B-6C support the detection of a metallic or an electronic object via analyzing the signatures or characteristics of the magnetic field variance. As shown in FIG. 6A, another alternative approach to detect an electronic object is via, e.g., communication means by detecting a signal from an active electronic device. FIG. 7A depicts an exemplary high level architecture of a system implemented in a security post for detecting metallic/electronic objects, in accordance with an embodiment of the present teaching. The illustrated architecture comprises different layers of processing, including an Internet of Things (IoT) platform layer 700, a modeling layer 710, an information analysis layer 720, and an information collection layer 730.

The information collection layer 730 includes means to receive information from different sources in order to facilitate the detection. Such received information is then sent to different information analysis means at the information analysis layer 720 for signal processing and detection of target object. In this illustrated architecture, depending on the detection result (achieved at the information analysis layer 720), the information collection layer 730 may be further invoked to collect additional information so that the information flow between the information collection layer 730 and the information analysis layer 720 is bi-directional. In analyzing information collected by the information collection layer 730, the information analysis layer 720 may utilize models stored in the modeling layer 710 to facilitate its analysis. For example, models ay be trained on how to detect metallic and electronic objects based on signatures of magnetic field variances. The modeling layer 710 may include various training mechanisms provided for obtaining, via training based on training data, appropriate models to be used by the information analysis layer 720 for different types of detection purposes. In some embodiments, the training data may be supplied to the modeling layer 710 via the IoT platform 700, which may be connected with many sources via network connections.

As discussed herein, the information collection layer 730 may gather, in addition to the magnetic fields information for detecting target objects, also other types of information such as biometric information and surround information. Such information is acquired, e.g., after a target object is detected to acquire information related to the target object. FIG. 7B shows different types of information that a security post may further gather and extract, in accordance with an embodiment of the present teaching. As illustrated, biometric/surround information that a security post may request to acquire or extract includes facial information of the person with the detected metallic/electronic object, the physical features of the person, . . . , and some features related to the spatial environment. Additional characteristics of the person and the surrounding may also be extracted from the acquired sensor information. For example, facial features may be extracted that can be used to, e.g., recognize the identity of the person. Facial features may also be used to estimate emotional state of the person (e.g., nervous). Based on the acquired visual information, certain physical characteristics may also be estimated, including but not limited to, physiological features of the person (e.g., height, hair color, body build, color of the jacket, etc.), behavior estimated (e.g., hand waving, shouting, limb, etc.), and motion (e.g., how fast the person is walking). Surround information may also be acquired from the scene where the target object is detected and then used to estimate certain spatial parameters associated with the person such as the spatial location/position of the person and/or a distance between the person and a certain point of reference in the space.

Figure 7C:
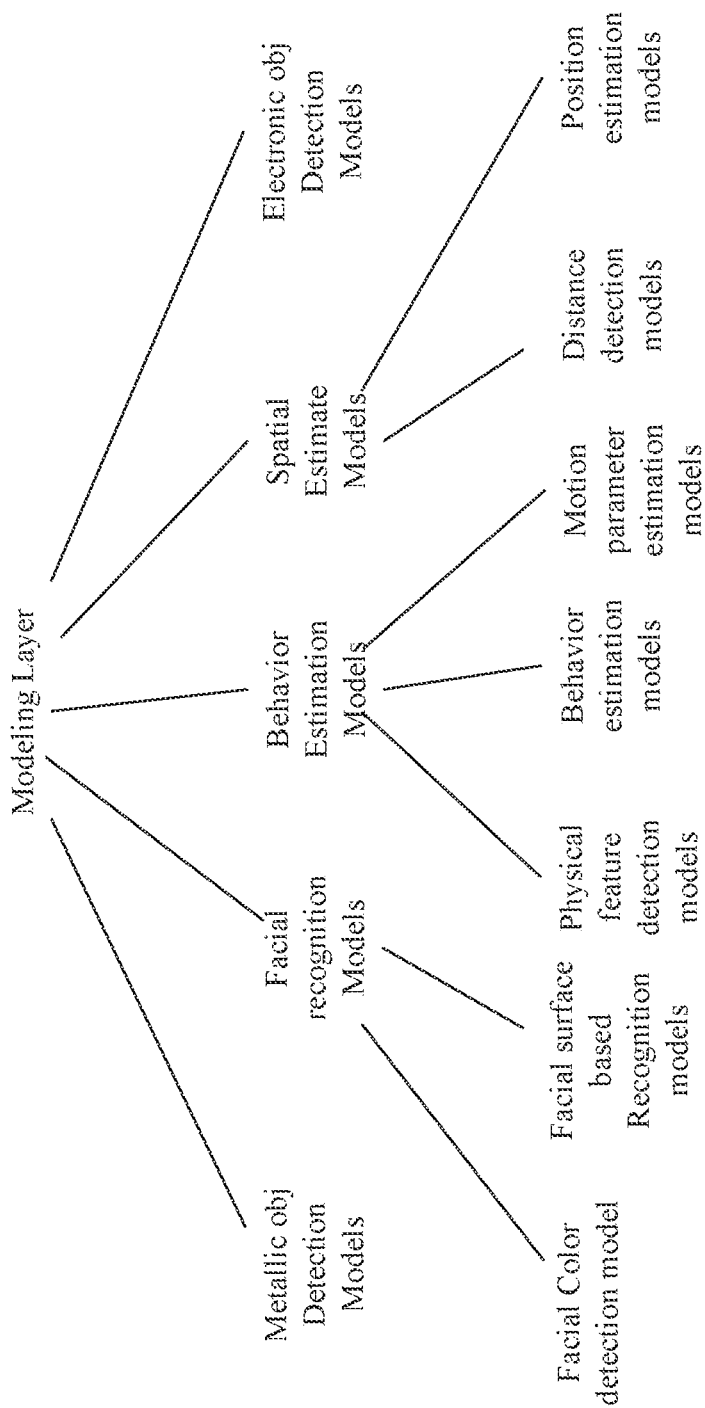
FIG. 7C shows different types of models that a security post uses for detecting different types of information, in accordance with an embodiment of the present teaching.

To assist the extraction and estimation of the various features as discussed herein, different models may be trained at the modeling layer 710. FIG. 7C shows different types of models that a security post may use for detecting different types of information, in accordance with an embodiment of the present teaching. As discussed herein, the modeling layer 710 may utilize training data gathered at the IoT layer 700 to train models for different purposes. For example, the detection of metallic and/or electronic objects may be performed based on models trained based on training data from previously confirmed detections. The models for detecting metallic objects may be derived so that they provide guidance on subsequent detections. Similarly, models for detecting an electronic object may also be trained based on past ground truth training data that provide information on the expected characteristics associated with the magnetic field variance observed from electronic objects. Such expected characteristics in magnetic field variance for electronic objects may be distinguished from that for metallic objects. Such distinctions may also be embedded in the corresponding models learned for each type of such target objects.

In addition, as discussed herein, additional information may also be analyzed in connection with each detection of a target object. For instance, once a target object is detected (either a metallic object or an electronic object), biometric, behavior, physical, or spatial information surrounding the detection may be acquired so that further information may be provided for each detection. To fulfill that, models may be trained for deriving such additional information. For example, models for facial recognition, for estimating behaviors of a person, and for estimating spatial features related to the person may also be trained and used. The models for estimating facial related features may include facial color detection models for detecting color patches in images that correspond to human faces and/or facial surface models which use depth information associated with a human face to recognize a person. Similarly, models for estimating behavior of a person may also be trained to estimate physical features (such as height or the person or hand waving) of a person and/or certain behavior (such as angry) of the person. Models for estimating motion parameters associated with the person may also be trained. In some embodiments, models may also be obtained via training for determining a distance and/or specific positions of the person, as shown in FIG. 7C.

The information analysis layer 720 as shown in FIG. 7A may include various modules that may control the information collection layer 730 to obtain needed information and process the signals from the information collection layer 730 based on models provided by the modeling layer 710. In some embodiments, the information analysis layer 720 may include signal processing units in different sections as well as the signal integration unit 610 (see FIG. 6B), which may be integrated or organized generically as a target object and surrounding information detection module. As discussed herein, an electronic object (such as a smart phone or a tablet) may be distinguished from a metallic object by detection of a distinct patterns in magnetic field variance caused by the amount of metal in the object. An electronic object may be alternatively detected via communication means when the electronic object is active (i.e., turned on). In some embodiments, the two different approaches to detect an electronic object may be used in different operational modes, e.g., either together or separately. For instance, based on analysis of the magnetic field variance, the initial estimate may be derived as to whether an electronic object is detected and then followed by a confirmation using a communication means. As another example, the metallic object may be detected based on analysis of the sensed magnetic field variance while an electronic object may be separately detected using the communication means.

Figure 8A:
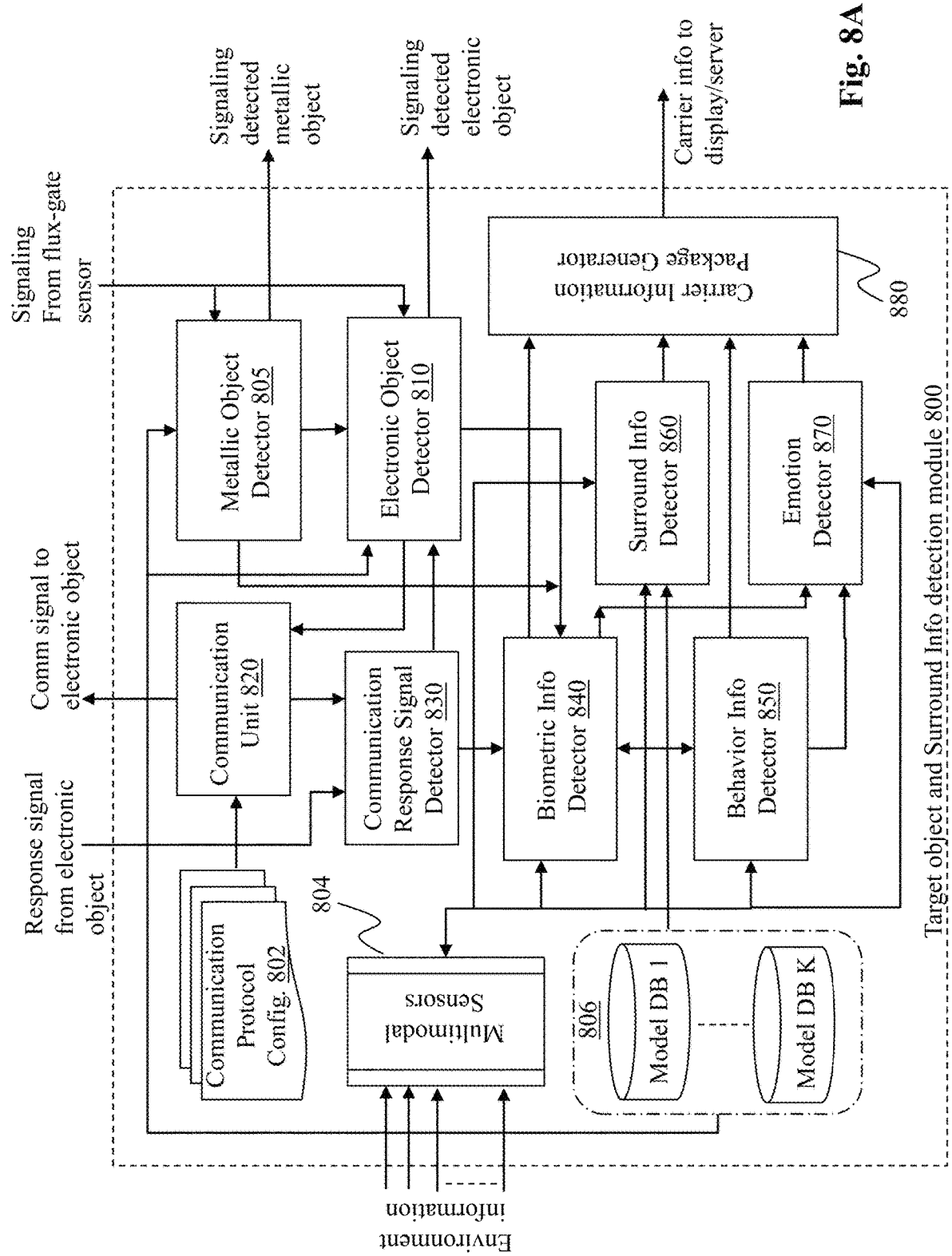
FIG. 8A depicts an exemplary high level diagram of a system in a security post for detecting metallic/electronic objects, in accordance with an embodiment of the present teaching.

FIG. 8A depicts an exemplary high level diagram of a module 800 in a security post for detecting target objects and surrounding information, in accordance with an embodiment of the present teaching. In this illustrated embodiment, a target object and surrounding information detection module 800 comprises a number of units for detecting metallic/electronic objects, including a metallic object detector 805, an electronic object detector 810, a communication unit 820, and a communication response signal detector 830. In some embodiments, in operation, when the signals from the sensing portion (e.g., flux-gate sensors) are received, the metallic object detector 805 analyze the signals to detect magnetic signal variance. The detection may be based on one or more models stored in a model storage 806 for detecting metallic objects. As discussed herein, the models for detecting metallic objects may be generated based on machine learning in accordance with training data representing, e.g., magnetic field variances caused by presence of metallic objects. If a metallic object is detected, the metallic object detector 805 sends a signal out indicating the presence of the metallic object.

The electronic object detector 810 may also proceed to detect the presence of an electronic object. In some embodiments, it may operate when there is no metallic object is detected and the metallic object detector 805 informs it so. In some embodiments, the electronic object detector 810 may also receive the sensed magnetic signals from the flux-sensors and analyze the magnetic field variance to detect presence of an electronic object. For example, the magnetic field variance caused by an electronic object may have a signature that differs from that caused by a metallic object or absence of both metallic and electronic objects. The detection may be based on one or more models stored in a model storage 806 for detecting electronic objects. As discussed herein, the models for detecting electronic objects may be generated based on machine learning in accordance with training data representing, e.g., magnetic field variances caused by presence of electronic objects. In some embodiments, the distribution of magnetic field variances due to presence of electronic object may be captured in the models. In some embodiments, the distinction between the distribution of magnetic field variances for electronic objects and that for metallic objects may also be captured in the models for detecting metallic and electronic objects.

Detection of an electronic object via analysis of magnetic field variance may be further confirmed using communication means. In some embodiments, the detection of an electronic object that is turned on may rely directly on communication means without going through the analysis of the magnetic field variance. To detect an electronic object that is turned on via communication means, the electronic object detector 810 invokes the communication unit 820 to send a communication signal in a pre-determined scope or range in accordance with one or more communication protocols stored in a communication protocol configuration storage 802. As discussed herein, the communication protocol may be any of the communication frameworks and their corresponding protocols, including, but not limited to, WiFi, Bluetooth, etc. Complying with the protocols of different wireless communication frameworks, the communication unit 820 sends communication signals out and then inform the communication response signal detector 830 to wait to see if a response signal is received. If a response signal is received by the communication response signal detector 830, then an electronic object is present and the electronic object detector 810 sends out a signal indicating the detection of an electronic object.

As discussed herein, in some embodiments, additional information may be acquired that may assist to reveal more about the scenario associated with the detection of a metallic or electronic object. Such additional information includes biometric information of a person associated with the detected target object, the behavior/physical/spatial information observed in the scenario. To achieve that, the target object and surrounding information detection unit 800 further comprises, e.g., a biometric information detector 840, a surround information detector 860, a behavior information detector 850, and an emotion detector 870. In some embodiments, upon detecting a metallic or an electronic object, the biometric information detector 840 may be invoked to acquire the biometric information of the carrier of the detected metallic or electronic objects. Such biometric information may include facial information or any information related to the body of the carrier.

In some embodiments, depending on the application needs, other modules for detecting other types of information may also be invoked to gather other types of information. For instance, surround information detector 860 may be activated (not shown) to gather information of the surrounding scenario and analyze it and produce useful information. In addition, emotion and/or behavior of the carrier may also be informative so that the behavior information detector 850 and/or the emotion detector 870 may also be invoked to gather information for analysis. To support such activities, each of the modules being activated activate relevant sensors in the cluster of multimodal sensors 804 and gather the information needed from the environment. The multimodal sensors may include, but not limited to, visual sensors, acoustic sensors, depth sensors, or any other types of sensors.

Based on the acquired sensor information, each of the invoked modules may act on information relevant and extract or identify informative features. For instance, the biometric information detector 840 may gather, e.g., visual facial information and extract relevant features characterizing the face of the person. The surround information detector 860 may gather visual images of the environment the person is in and estimate, e.g., various information related to the environments or spatial characteristics of the environment such as estimated position of the person or distance from the camera acquiring the images. The behavior information detector 850 may gather sensor data to facilitate it analysis of the behavior of the person. Behavior of a person may be observed both visually (e.g., waving a first) and acoustically (e.g., shouting) and estimated based on sensor information from different modalities. The emotion detector 870 may also be applied to analyze, e.g., facial expression of the person to detect certain types of emotions such as angry, upset, scared, etc. Such information about the person and the surrounding derived from the multimodal sensory data may be based on various models stored in 806. To send such derived information to the display screen or a server, different types of information obtained by various detectors (840, 850, 860, and 870) may then be sent to a carrier information package generator 880 where all information is to be organized and then sent out for display on the screen 620 or being sent to the server 650 (see FIG. 6B).

Figure 8B:
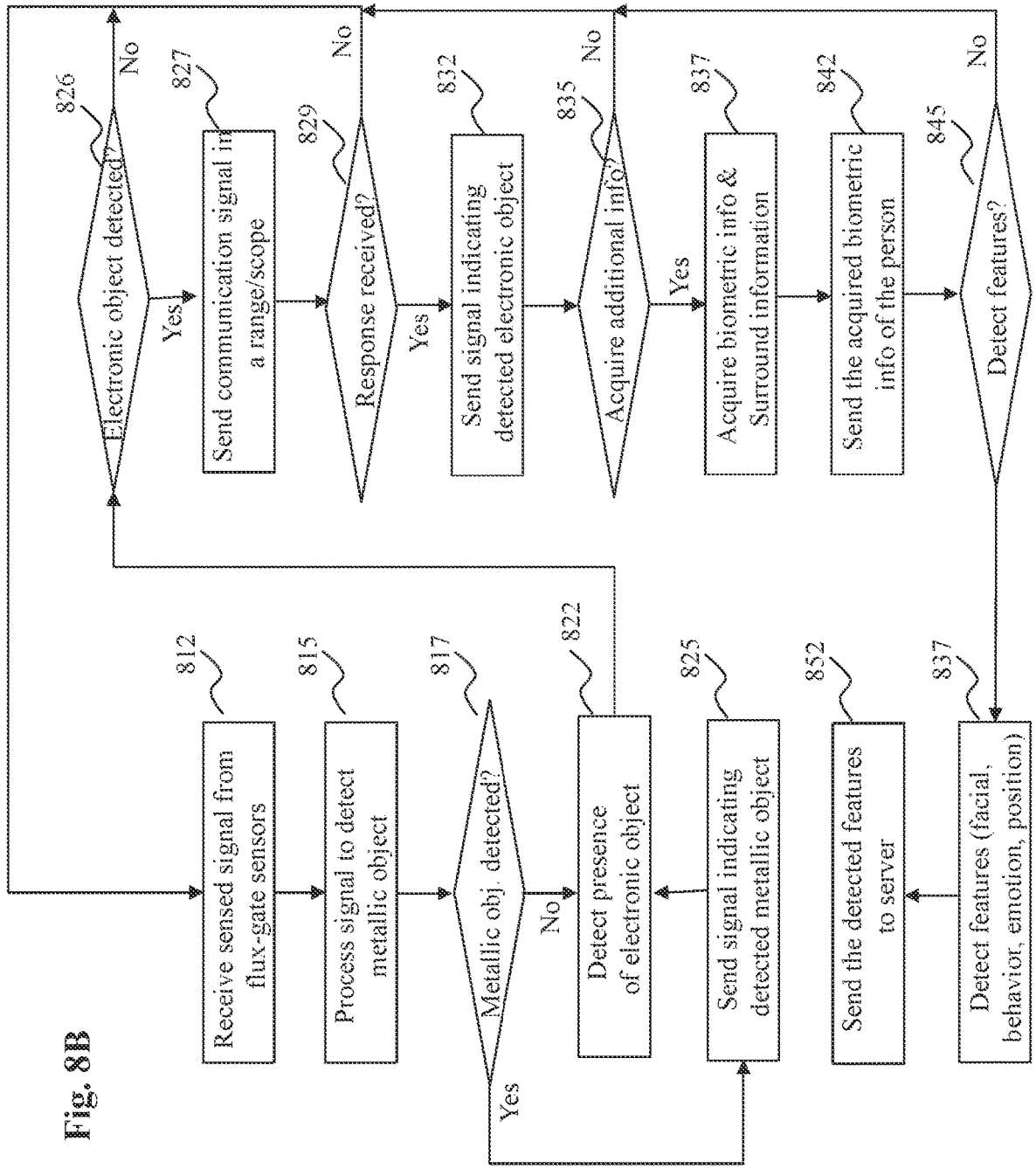
FIG. 8B is a flowchart of an exemplary process of a system in a security post for detecting metallic/electronic objects, in accordance with an embodiment of the present teaching.

FIG. 8B is a flowchart of an exemplary process of the target object and surround information detection module 800, in accordance with an embodiment of the present teaching. In operation, the magnetic field variations sensed by, e.g., flux-gate sensors, is first received at 812. Such received information is processed, at 815, to detect whether a metallic object is present. If there is no metal detected, determined at 817, the processing further detects, at 822, whether an electronic object is present. If a metallic object is detected, determined at 817, the signal processing unit triggers the section alarm to report the detection by sending, at 825, a signal indicating the same and then proceed to 822 to detect whether an electronic object is present.

In some situations, it is possible that an electronic object co-exists with a metallic object. When both metallic and electronic objects are to be detected, the threshold used to determine whether there is any metal detected may be set quite low (because an electronic object may contain quite low amount of metal). If the detected metal exceeds the threshold, then the determination of both metallic and electronic object is performed. In this situation, even after a metallic object is detected, the process proceeds to detect an electronic object. As discussed herein, as the level of metal in an electronic object is relatively low and the reliability of detecting the presence of an electronic object may be enhanced via other means.

When an electronic object is detected based on magnetic field variations, determined at 826, the processing may optionally proceed to use communication means to confirm or enhance the detection for an electronic object that is turned on. To detect an electronic object that is turned on via communication means, the communication unit 820 in FIG. 8A sends out, at 827, one or more communication signals in accordance with some communication protocols with predetermined range and parameters and triggers the communication response signal detector 830 to detect any response signals from an electronic object. If no response signal is received, determined at 829, it indicates that no electronic object that is on is detected. In this case, the processing proceeds to step 812 for the next detection. If a response signal is received, it indicates that a turned-on electronic device is detected. In this case, the communication response signal detector 830 informs the electronic object detector 810 which sends out, at 832, a signal to the security post to report a detection of an electronic object.

As discussed herein, after the detection of metallic/electronic objects, additional information associated with the detection may be acquired, analyzed, and reported. If no additional information is to be acquired, determined at 835, the processing proceeds to step 812 for the next detection. If additional information is to be acquired, the multimodal sensors 804 are activated to acquire, at 837, e.g., biometric and surround information. Some of such acquired information such as biometric information of the person who carries the detected target object may be sent out, at 842, to e.g., the server 650 via network 640 for archiving the evidence of the detection event. If additional information is to be used to extract other relevant features, determined at 845, that characterize in more detail of the surrounding related to the person carrying the detected target object, various modules (e.g., 840, 850, 860, and/or 870) may be invoked to detect, at 837, different characteristics associated with the person and the surrounding environment. This includes, but not limited to, as facial features, spatial features (distance, position, etc.), emotion related assessment, behavior related assessment, etc. Such features, once extracted, may then be sent, at 852, to, e.g., the server 650 for archiving the surrounding evidence associated with the detection.

Figure 9:
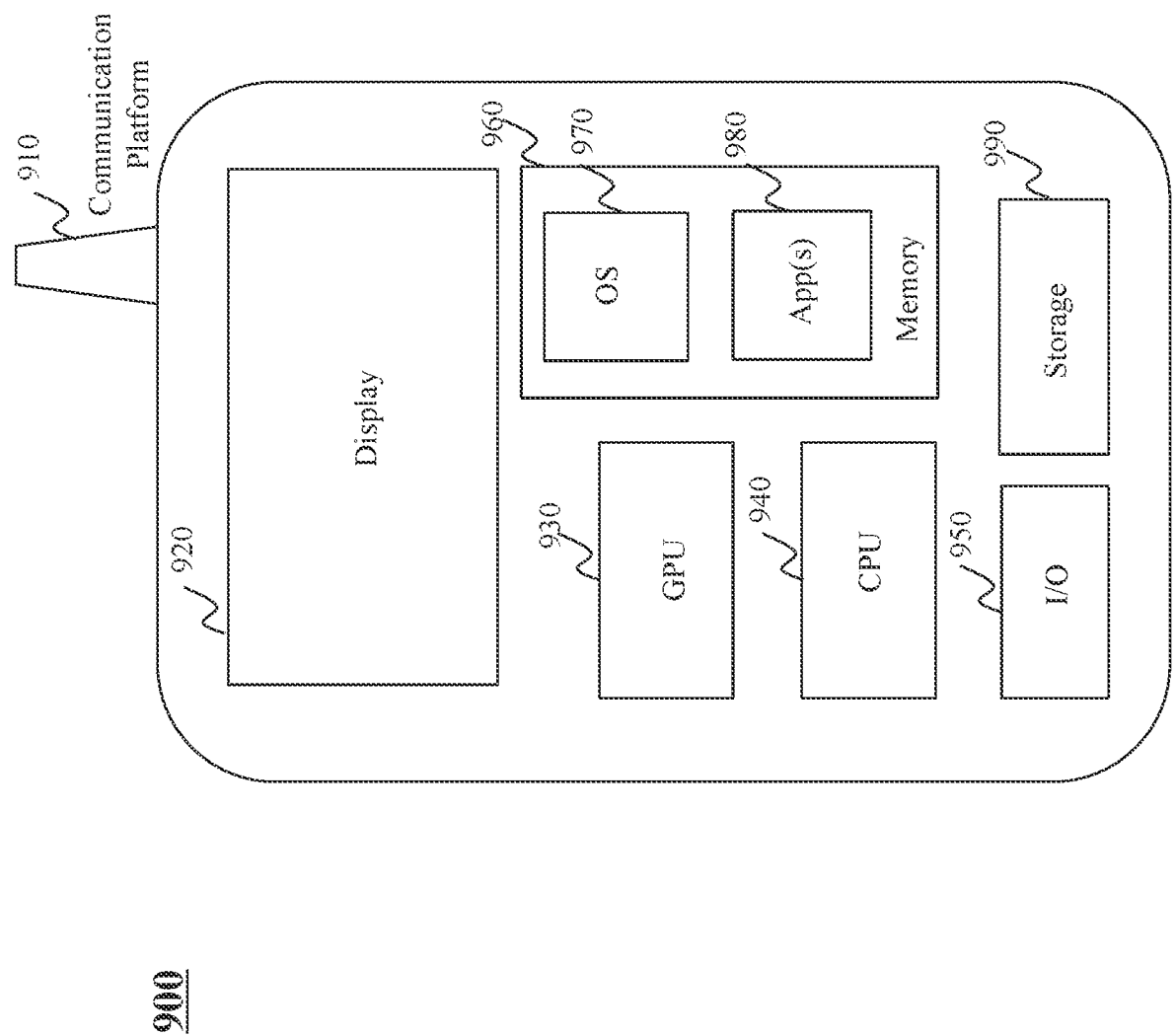
FIG. 9 is an illustrative diagram of an exemplary mobile device architecture that may be used to realize a specialized system implementing the present teaching in accordance with various embodiments.

FIG. 9 is an illustrative diagram of an exemplary mobile device architecture that may be used to realize a specialized system implementing the present teaching in accordance with various embodiments. In this example, a device on which the present teaching is implemented corresponds to a mobile device 900, including, but not limited to, a smart phone, a tablet, a music player, a handled gaming console, a global positioning system (GPS) receiver, and a wearable computing device (e.g., eyeglasses, wrist watch, etc.), or in any other form factor. Mobile device 900 may include one or more central processing units ("CPUs") 940, one or more graphic processing units ("GPUs") 930, a display 920, a memory 960, a communication platform 910, such as a wireless communication module, storage 990, and one or more input/output (I/O) devices 940. Any other suitable component, including but not limited to a system bus or a controller (not shown), may also be included in the mobile device 900. As shown in FIG. 9 a mobile operating system 970 (e.g., iOS, Android, Windows Phone, etc.), and one or more applications 980 may be loaded into memory 960 from storage 990 in order to be executed by the CPU 940. The applications 980 may include a browser or any other suitable mobile apps for managing a conversation system on mobile device 900. User interactions may be achieved via the I/O devices 940 and provided to the automated dialogue companion via network(s) 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to appropriate settings as described herein. A computer with user interface elements may be used to implement a personal computer (PC) or other type of workstation or terminal device, although a computer may also act as a server if appropriately programmed. It is believed that those skilled in the art are familiar with the structure, programming and general operation of such computer equipment and as a result the drawings should be self-explanatory.

FIG. 10 is an illustrative diagram of an exemplary computing device architecture that may be used to realize a specialized system implementing the present teaching in accordance with various embodiments. Such a specialized system incorporating the present teaching has a functional block diagram illustration of a hardware platform, which includes user interface elements. The computer may be a general purpose computer or a special purpose computer. Both can be used to implement a specialized system for the present teaching. This computer 1000 may be used to implement any component of conversation or dialogue management system, as described herein. For example, conversation management system may be implemented on a computer such as computer 1000, via its hardware, software program, firmware, or a combination thereof. Although only one such computer is shown, for convenience, the computer functions relating to the conversation management system as described herein may be implemented in a distributed fashion on a number of similar platforms, to distribute the processing load.

Computer 1000, for example, includes COM ports 1050 connected to and from a network connected thereto to facilitate data communications. Computer 1000 also includes a central processing unit (CPU) 1020, in the form of one or more processors, for executing program instructions. The exemplary computer platform includes an internal communication bus 1010, program storage and data storage of different forms (e.g., disk 1070, read only memory (ROM) 1030, or random access memory (RAM) 1040), for various data files to be processed and/or communicated by computer 1000, as well as possibly program instructions to be executed by CPU 1020. Computer 1000 also includes an I/O component 1060, supporting input/output flows between the computer and other components therein such as user interface elements 1080. Computer 1000 may also receive programming and data via network communications.

Hence, aspects of the methods of dialogue management and/or other processes, as outlined above, may be embodied in programming. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives and the like, which may provide storage at any time for the software programming.

All or portions of the software may at times be communicated through a network such as the Internet or various other telecommunication networks. Such communications, for example, may enable loading of the software from one computer or processor into another, for example, in connection with conversation management. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to tangible "storage" media, terms such as computer or machine "readable medium" refer to any medium that participates in providing instructions to a processor for execution.

Hence, a machine-readable medium may take many forms, including but not limited to, a tangible storage medium, a carrier wave medium or physical transmission medium. Non-volatile storage media include, for example, optical or magnetic disks, such as any of the storage devices in any computer(s) or the like, which may be used to implement the system or any of its components as shown in the drawings. Volatile storage media include dynamic memory, such as a main memory of such a computer platform. Tangible transmission media include coaxial cables; copper wire and fiber optics, including the wires that form a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a physical processor for execution.

Those skilled in the art will recognize that the present teachings are amenable to a variety of modifications and/or enhancements. For example, although the implementation of various components described above may be embodied in a hardware device, it may also be implemented as a software only solution—e.g., an installation on an existing server. In addition, the fraudulent network detection techniques as disclosed herein may be implemented as a firmware, firmware/software combination, firmware/hardware combination, or a hardware/firmware/software combination.

While the foregoing has described what are considered to constitute the present teachings and/or other examples, it is understood that various modifications may be made thereto and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

We claim:

1. A method implemented on a security post having at least one processor and communication platform capable of connecting to a network for detecting a target object, the method comprising:
   receiving information from one or more sensors deployed on each of a plurality of sections of the security post, wherein the plurality of sections of the security post are arranged in a vertical direction and each of the sections is designated to detect the target object within a vertical range;
   for each of the sections for a corresponding vertical range of the security post,
      analyzing the information received from corresponding one or more sensors to extract features characterizing magnetic field variations sensed in the corresponding vertical range,
      determining whether the target object is detected within the corresponding vertical range based on the extracted features, and
      triggering, if the target object is detected, an alarm associated with the section to indicate a detection of the target object within the corresponding vertical range;
   determining an overall detection result based on the detection from each of the plurality of sections;
   displaying, on a display screen, the overall detection result and
   determining, by detecting a signal from an active electronic device that is turned on, whether the active electronic device that is turned on is present near the security post.

2. The method of claim 1, wherein the target object includes at least one of a metallic object and an electronic object.

3. The method of claim 2, wherein the step of determining comprises
classifying based on the extracted features in accordance with one or more models representing different types of target objects, wherein the one or more models are derived via machine learning based on training data related to magnetic field variations caused by presence of the different types of target objects; and
determining whether the target object is present based on the classification result.

4. The method of claim 1, wherein the one or more sensors include a flux-gate sensor.

5. The method of claim 1, wherein the plurality of sections include a lower section, a middle section, and an upper section that are assembled in an alignment.

6. The method of claim 1, further comprising gathering, in the event that the target object is detected, additional information related to the person with the target object and/or surround information.

7. A non-transitory machine readable medium having information recorded thereon for detecting a target object via a security post, wherein the information, when read by the machine, causes the machine to perform:
receiving information from one or more sensors deployed on each of a plurality of sections of the security post, wherein the plurality of sections of the security post are arranged in a vertical direction and each of the sections is designated to detect the target object within a vertical range;
for each of the sections for a corresponding vertical range of the security post,
analyzing the information received from corresponding one or more sensors to extract features characterizing magnetic field variations sensed in the corresponding vertical range,
determining whether the target object is detected within the corresponding vertical range based on the extracted features, and
triggering, if the target object is detected, an alarm associated with the section to indicate a detection of the target object within the corresponding vertical range;
determining an overall detection result based on the detection from each of the plurality of sections;
displaying, on a display screen, the overall detection result and
determining, by detecting a signal from active electronic device that is turned on, whether the active electronic device that is turned on is present near the security post.

8. The non-transitory machine readable medium of claim 7, wherein the target object includes at least one of a metallic object and an electronic object.

9. The non-transitory machine readable medium of claim 8, wherein the step of determining comprises
classifying based on the extracted features in accordance with one or more models representing different types of target objects, wherein the one or more models are derived via machine learning based on training data related to magnetic field variations caused by presence of the different types of target objects; and
determining whether the target object is present based on the classification result.

10. The non-transitory machine readable medium of claim 7, wherein the one or more sensors include a flux-gate sensor.

11. The non-transitory machine readable medium of claim 7, wherein the plurality of sections include a lower section, a middle section, and an upper section that are assembled in an alignment.

12. The non-transitory machine readable medium of claim 7, wherein when the information is read by the machine, it further causes the machine to perform gathering, in the event that the target object is detected, additional information related to the person with the target object and/or surround information.

13. A security post, comprising:
a base;
an overall alarm; and
a plurality of sections arranged in a vertical direction between the base and the overall alarm, each of the plurality of sections being designated to detect the target object within a corresponding vertical range; and
a signal integration unit configured for integrating the detection results from the plurality of sections to derive an overall detection result, wherein
each of the sections comprises:
one or more sensors configured for sensing information related to magnetic field in the corresponding vertical range,
a signal processing unit configured for analyzing the information to extract features characterizing magnetic field variations sensed by the one or more sensors, determining whether the target object is detected within the corresponding vertical range based on the extracted features, and determining, by detecting a signal from an active electronic device that is turned on, whether the active electronic device that is turned on is present near the security post, and
a section alarm configured to be triggered when the target object is detected.

14. The security post of claim 13, wherein the target object includes at least one of a metallic object and an electronic object.

15. The security post of claim 14, further comprising an alarm triggering unit configured to activate the overall alarm when the overall result indicates that the target object is detected.

16. The security post of claim 14, wherein the signal integration unit is further configured to send the overall detection result to a server via a network connection.

17. The security post of claim 13, wherein the one or more sensors include a flux-gate sensor.

18. The security post of claim 13, wherein the plurality of sections include a lower section, a middle section, and an upper section that are assembled in an alignment.

* * * * *